(12) United States Patent
Tanigawa et al.

(10) Patent No.: US 11,286,346 B2
(45) Date of Patent: Mar. 29, 2022

(54) RESIN COMPOSITION, SUPPORT WITH RESIN LAYER, PREPREG, LAMINATE, MULTILAYERED PRINTED WIRING BOARD, AND PRINTED WIRING BOARD FOR MILLIMETER-WAVE RADAR

(71) Applicant: Hitachi Chemical Company, LTD., Tokyo (JP)

(72) Inventors: Takao Tanigawa, Tokyo (JP); Tetsuroh Irino, Tokyo (JP); Yuusuke Kondou, Tokyo (JP); Yuichi Shimayama, Tokyo (JP); Etsuo Mizushima, Tokyo (JP); Tomio Fukuda, Tokyo (JP); Yuki Nagai, Tokyo (JP); Hikari Murai, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 0 days.

(21) Appl. No.: 15/543,078

(22) PCT Filed: Jan. 13, 2016

(86) PCT No.: PCT/JP2016/050788
§ 371 (c)(1),
(2) Date: Jul. 12, 2017

(87) PCT Pub. No.: WO2016/114286
PCT Pub. Date: Jul. 21, 2016

(65) Prior Publication Data
US 2018/0002485 A1 Jan. 4, 2018

(30) Foreign Application Priority Data

Jan. 13, 2015 (JP) .............................. JP2015-004070
Jan. 13, 2015 (JP) .............................. JP2015-004071
Apr. 17, 2015 (JP) .............................. JP2015-084633

(51) Int. Cl.
| | | |
|---|---|---|
| *C08G 73/10* | (2006.01) | |
| *C08J 5/24* | (2006.01) | |
| *B32B 27/34* | (2006.01) | |
| *H05K 3/46* | (2006.01) | |
| *H05K 1/03* | (2006.01) | |
| *C08G 73/12* | (2006.01) | |
| *C08L 79/08* | (2006.01) | |
| *B32B 27/28* | (2006.01) | |

(52) U.S. Cl.
CPC ............ *C08G 73/10* (2013.01); *B32B 27/281* (2013.01); *B32B 27/34* (2013.01); *C08G 73/1014* (2013.01); *C08G 73/1082* (2013.01); *C08G 73/12* (2013.01); *C08G 73/122* (2013.01); *C08J 5/24* (2013.01); *C08L 79/08* (2013.01); *H05K 1/03* (2013.01); *H05K 1/036* (2013.01); *H05K 3/46* (2013.01); *H05K 3/4652* (2013.01); *C08L 2205/02* (2013.01); *C08L 2205/03* (2013.01)

(58) Field of Classification Search
CPC .............. C08L 79/085; C08L 2205/02; C08L 2205/025; C08L 2666/14; C08L 2666/20; C08L 2666/22
See application file for complete search history.

(56) References Cited

U.S. PATENT DOCUMENTS

| | | | | |
|---|---|---|---|---|
| 4,608,426 A * | 8/1986 | Stern | ..................... | C08G 73/122 526/262 |
| 5,770,676 A | 6/1998 | Pater et al. | | |
| 10,434,750 B2 * | 10/2019 | Takeuchi | ................ | B32B 15/08 |
| 2004/0225059 A1 * | 11/2004 | Mizori | ................. | C07D 403/14 524/811 |
| 2009/0178832 A1 * | 7/2009 | Amou | ....................... | B32B 3/18 174/258 |
| 2010/0203324 A1 | 8/2010 | Iizumi | | |
| 2011/0130485 A1 * | 6/2011 | Mizori | ............... | C07D 207/452 522/167 |
| 2013/0209802 A1 | 8/2013 | Muraki et al. | | |
| 2017/0051109 A1 * | 2/2017 | Mizuno | ................ | H05K 1/0373 |

FOREIGN PATENT DOCUMENTS

| | | |
|---|---|---|
| CN | 1033061 A | 5/1989 |
| CN | 101516616 A | 8/2009 |
| CN | 101619123 A | 1/2010 |
| CN | 101921482 A | 12/2010 |
| EP | 3127936 | 2/2017 |
| JP | S47-011834 B | 4/1972 |
| JP | 356-133355 A | 10/1981 |
| JP | S57-167324 A | 10/1982 |
| JP | S58-069046 A | 4/1983 |
| JP | S58-132010 A | 8/1983 |
| JP | 359-193929 A | 11/1984 |
| JP | S61-018937 A | 5/1986 |
| JP | H1-053700 B2 | 11/1989 |
| JP | H3-275760 A | 12/1991 |
| JP | H4-096934 A | 3/1992 |
| JP | H5-077705 B2 | 10/1993 |
| JP | H5-271411 A | 10/1993 |

(Continued)

OTHER PUBLICATIONS

International Search Report for PCT/JP2016/050788 dated Mar. 29, 2016; English translation submitted herewith (6 pages).

*Primary Examiner* — Ana L. Woodward
(74) *Attorney, Agent, or Firm* — Fitch, Even, Tabin & Flannery, L.L.P.

(57) ABSTRACT

The present invention relates to a resin composition containing a compound having a maleimido group, a divalent group having at least two imido bonds and a saturated or unsaturated divalent hydrocarbon group.

22 Claims, 4 Drawing Sheets

(56) References Cited

FOREIGN PATENT DOCUMENTS

| | | |
|---|---|---|
| JP | H6-184213 A | 7/1994 |
| JP | H7-188362 A | 7/1995 |
| JP | H8-012914 A | 1/1996 |
| JP | H9-279121 A | 10/1997 |
| JP | H11-106454 A | 4/1999 |
| JP | H11-124451 A | 5/1999 |
| JP | 2000-509097 A | 7/2000 |
| JP | 2002-265777 A | 9/2002 |
| JP | 2003-128892 A | 5/2003 |
| JP | 2003-138133 A | 5/2003 |
| JP | 2006-516297 A | 6/2006 |
| JP | 2006-526014 A | 11/2006 |
| JP | 2007-231125 A | 9/2007 |
| JP | 2008-095061 A | 4/2008 |
| JP | 2008-115280 A | 5/2008 |
| JP | 2011-012124 A | 1/2011 |
| JP | 2011-091066 A | 5/2011 |
| JP | 2011-162631 A | 8/2011 |
| JP | 2012-001486 A | 1/2012 |
| JP | 2012-197372 A | 10/2012 |
| JP | 2012-255059 A | 12/2012 |
| JP | 2013-211348 A | 10/2013 |
| JP | 2014-001289 A | 1/2014 |
| JP | 2014-034630 A | 2/2014 |
| JP | 2014-165529 A | 9/2014 |
| JP | 2015-032639 A | 2/2015 |
| JP | WO 2015/152427 A1 * | 8/2015 |
| JP | 2015-193725 A | 11/2015 |
| JP | 2016-196549 A | 11/2016 |
| TW | 201305245 A | 2/2013 |
| WO | 98/036015 A1 | 8/1998 |
| WO | 2004/067634 A1 | 8/2004 |
| WO | 2008/013288 A1 | 12/2009 |
| WO | 2010/019832 A2 | 2/2010 |
| WO | 2014/181456 A1 | 11/2014 |
| WO | 2016/031554 A1 | 3/2016 |
| WO | 2016/031555 A1 | 3/2016 |

* cited by examiner (a)

(b)

(c)

(p)

(q)

(r)

(a)

(b)

(c)

(a')

(c')

(b')

(d')

RESIN COMPOSITION, SUPPORT WITH RESIN LAYER, PREPREG, LAMINATE, MULTILAYERED PRINTED WIRING BOARD, AND PRINTED WIRING BOARD FOR MILLIMETER-WAVE RADAR

CROSS-REFERENCE TO RELATED APPLICATIONS

This application is a U.S. national phase application filed under 35 U.S.C. § 371 of International Application PCT/JP2016/050788, filed on Jan. 13, 2016, designating the United States, which claims benefit of the filing dates of JP 2015-004070, filed Jan. 13, 2015, JP 2015-004071, filed Jan. 13, 2015, and JP 2015-084633, filed Apr. 17, 2015, each of which is hereby incorporated herein by reference in its entirety.

TECHNICAL FIELD

The present invention relates to a resin composition, a support with a resin layer, a prepreg, a laminate, a multilayered printed wiring board, and a printed wiring board for a millimeter-wave radar.

BACKGROUND ART

In mobile communication devices represented by cell phones, base station apparatuses thereof, network infrastructure devices such as severs and routers, and electronic devices such as large computers, signals used are being increased year by year in the speed and the capacity. Along therewith, readiness for higher frequencies becomes necessary for printed wiring boards mounted on these electronic devices, and there are demanded substrate materials having a low relative dielectric constant and a low dielectric loss tangent which enable the transmission loss to be reduced. In recent years, as such applications handling high-frequency signals, besides in the above-mentioned electronic devices, also in ITS fields (automobiles, traffic system fields) and indoor short-distance communication fields, there have advanced the practical uses and practical plans of novel systems handling high-frequency radio signals; and it is supposed that hereafter, low-transmission loss substrate materials are further demanded on printed wiring boards mounted on these devices.

Further since from recent year's environmental problems, there have been demanded the mounting of electronic components by using a lead-free solder, and the flame retardation by the halogen freeness, there become necessary a higher heat resistance and flame retardancy for materials for printed wiring board than hitherto.

For printed wiring boards demanding a low transmission loss, as heat-resistant thermoplastic polymers exhibiting excellent high-frequency characteristics, polyphenylene ether (PPE)-based resins are conventionally used. In uses of polyphenylene ether-based resins, there are proposed, for example, methods of using a polyphenylene ether and a thermosetting resin in combination; and specifically, there are disclosed a resin composition containing a polyphenylene ether and an epoxy resin (for example, see Patent Literature 1), a resin composition using a polyphenylene ether and a cyanate ester resin, which is low in the relative dielectric constant among thermosetting resins, in combination (for example, see Patent Literature 2), and the like.

Further the present inventors propose a resin composition capable of being improved in compatibility, heat resistance, thermal expansion characteristics, adhesiveness to conductors and the like by using a polyphenylene ether resin and a polybutadiene resin as bases and making the resin composition to have a semi-IPN structure in its production stage (A-stage) (for example, see Patent Literature 3).

CITATION LIST

Patent Literature

Patent Literature 1: JP 58-69046 A1
Patent Literature 2: JP 61-18937 A1
Patent Literature 3: JP 2008-95061 A1

SUMMARY OF INVENTION

Technical Problem

For substrate materials for printed wiring boards to be used in the recent year's high-frequency band, there are demands of, in addition to the high-frequency characteristics, the density enhancement, the high reliability and the conformance to the environmental consideration, and therefore, it is further demanded that various types of characteristics be further excellent, such as the adhesiveness to conductors, the low thermal expansion characteristics, the high glass transition temperature, the high flame retardancy, the microwiring formability and the reflow heat resistance.

For example, with respect to the adhesiveness to conductors, when a low-profile copper foil having a very low surface roughness of the adhesive surface side thereof with a resin is used, it is desired that the copper foil peel strength be 0.6 kN/m or higher.

As the high-frequency characteristics, excellent dielectric characteristics in a higher-frequency band are of course demanded; for example, it is desired that the relative dielectric constant of a substrate material in the case where the material is composited with a common E glass base material be 3.7 or lower, and further 3.6 or lower. Furthermore, there has risen the necessity to meet not only the conventional dielectric characteristic value at 1 to 5 GHz but also the above required value in a high-frequency band of 10 or higher GHz band.

The present invention, in consideration of such a present situation, has an object to provide a resin composition having excellent high-frequency characteristics (low relative dielectric constant, low dielectric loss tangent) and having also the adhesiveness to conductors, the heat resistance and the low hygroscopic property in high levels, and a support with a resin layer, a prepreg, a laminate, a multilayered printed wiring board and a printed wiring board for a millimeter-wave radar which are produced by using the resin composition.

Solution to Problem

As a result of exhaustive studies to solve the above problem, the present inventors have found that a resin composition comprising a compound having a specific structure can solve the above problem, and this finding has led to the completion of the present invention.

That is, the present invention includes the following aspects.

[1] A resin composition comprising a compound having a maleimido group, a divalent group having at least two imido bonds, and a saturated or unsaturated divalent hydrocarbon group.

[2] The resin composition according to [1], wherein the divalent group having at least two imido bonds is a group represented by the following formula (I).

[Chemical Formula 1]

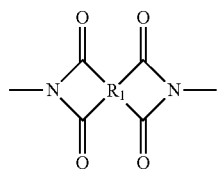
(I)

In the formula (I), $R_1$ represents a tetravalent organic group.

[3] The resin composition according to [1] or [2], wherein the number of carbon atoms of the saturated or unsaturated divalent hydrocarbon group is 8 to 100.

[4] The resin composition according to [1] or [2], wherein the saturated or unsaturated divalent hydrocarbon group is a group represented by the following formula (II).

[Chemical Formula 2]

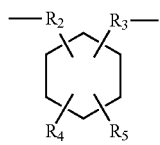
(II)

In the formula (II), $R_2$ and $R_3$ each independently represent an alkylene group having 4 to 50 carbon atoms; $R_4$ represents an alkyl group having 4 to 50 carbon atoms; and $R_5$ represents an alkyl group having 2 to 50 carbon atoms.

[5] The resin composition according to any one of [1] to [4], further comprising a maleimido group-containing compound different from the compound in [1].

[6] The resin composition according to [5], wherein the maleimido group-containing compound has a structure having the maleimido group bonded to an aromatic ring.

[7] The resin composition according to [5] or [6], wherein the maleimido group-containing compound is a compound represented by the following formula (VI).

[Chemical Formula 3]

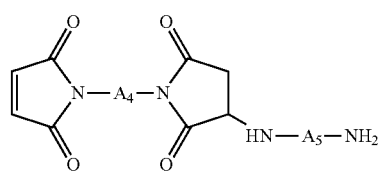
(VI)

In the formula (VI), $A_4$ represents a residue represented by the following formula (VII), (VIII), (IX) or (X); and $A_5$ represents a residue represented by the following formula (XI).

[Chemical Formula 4]

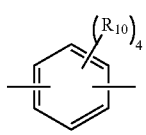
(VII)

In the formula (VII), $R_{10}$ each independently represent a hydrogen atom, an aliphatic hydrocarbon group having 1 to 5 carbon atoms or a halogen atom.

[Chemical Formula 5]

(VIII)

In the formula (VIII), $R_{11}$ and $R_{12}$ each independently represent a hydrogen atom, an aliphatic hydrocarbon group having 1 to 5 carbon atoms or a halogen atom; and $A_6$ represents an alkylene group or an alkylidene group having 1 to 5 carbon atoms, an ether group, a sulfide group, a sulfonyl group, a ketone group, a single bond or a residue represented by the following formula (VIII-1).

[Chemical Formula 6]

(VIII-1)

In the formula (VIII-1), $R_{13}$ and $R_{14}$ each independently represent a hydrogen atom, an aliphatic hydrocarbon group having 1 to 5 carbon atoms or a halogen atom; and $A_7$ represents an alkylene group having 1 to 5 carbon atoms, an isopropylidene group, an ether group, a sulfide group, a sulfonyl group, a ketone group or a single bond.

[Chemical Formula 7]

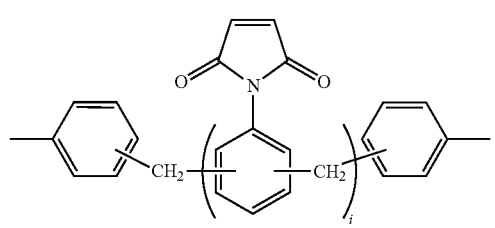
(IX)

In the formula (IX), i is an integer of 1 to 10.

[Chemical Formula 8]

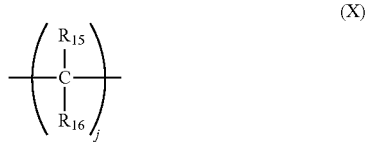

(X)

In the formula (X), $R_{15}$ and $R_{16}$ each independently represent a hydrogen atom or an aliphatic hydrocarbon group having 1 to 5 carbon atoms; and j is an integer of 1 to 8.

[Chemical Formula 9]

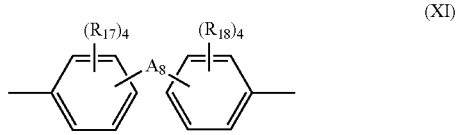

(XI)

In the formula (XI), $R_{17}$ and $R_{18}$ each independently represent a hydrogen atom, an aliphatic hydrocarbon group having 1 to 5 carbon atoms, an alkoxy group having 1 to 5 carbon atoms, a hydroxyl group or a halogen atom; and $A_8$ represents an alkylene group or an alkylidene group having 1 to 5 carbon atoms, an ether group, a sulfide group, a sulfonyl group, a ketone group, a fluorenylene group, a single bond, a residue represented by the following formula (XI-1) or a residue represented by the following formula (XI-2).

[Chemical Formula 10]

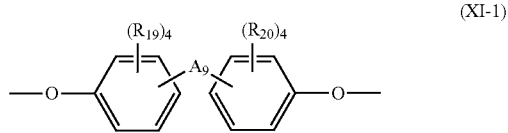

(XI-1)

In the formula (XI-1), $R_{19}$ and $R_{20}$ each independently represent a hydrogen atom, an aliphatic hydrocarbon group having 1 to 5 carbon atoms or a halogen atom; and $A_9$ represents an alkylene group having 1 to 5 carbon atoms, an isopropylidene group, a m-phenylenediisopropylidene group, a p-phenylenediisopropylidene group, an ether group, a sulfide group, a sulfonyl group, a ketone group or a single bond.

[Chemical Formula 11]

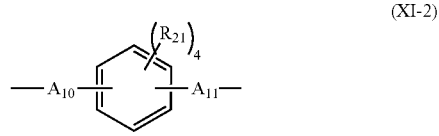

(XI-2)

In the formula (XI-2), $R_{21}$ each independently represent a hydrogen atom, an aliphatic hydrocarbon group having 1 to 5 carbon atoms or a halogen atom; and $A_{10}$ and $A_{11}$ each independently represent an alkylene group having 1 to 5 carbon atoms, an isopropylidene group, an ether group, a sulfide group, a sulfonyl group, a ketone group or a single bond.

[8] The resin composition according to any one of [1] to [7], wherein a relative dielectric constant at 10 GHz of a cured substance of the resin composition is 3.6 or lower.

[9] A support with a resin layer comprising a resin layer comprising the resin composition according to any one of [1] to [8], and a support base material.

[10] A prepreg comprising the resin composition according to any one of [1] to [8], and a fiber base material.

[11] A laminate comprising a resin layer comprising a cured substance of the resin composition according to any one of [1] to [8], and a conductor layer.

[12] A multilayered printed wiring board comprising a resin layer comprising a cured substance of the resin composition according to any one of [1] to [8], and at least three layers of circuit layers.

[13] The multilayered printed wiring board according to [11], wherein the number of the circuit layers is 3 to 20 layers.

[14] Application of the multilayered printed wiring board according to [12] or [13] to a millimeter-wave radar.

[15] A printed wiring board for a millimeter-wave radar comprising a resin layer comprising a cured substance of the resin composition according to any one of [1] to [8], and a circuit layer.

Advantageous Effects of Invention

According to the present invention, there can be provided a resin composition having excellent high-frequency characteristics (low relative dielectric constant, low dielectric loss tangent) and having also the adhesiveness to conductors, the heat resistance and the water absorbing property in high levels, and a support with a resin layer, a prepreg, a laminate, a multilayered printed wiring board and a printed wiring board for a millimeter-wave radar which are produced by using the resin composition.

The prepreg, the laminate, the multilayered printed wiring board and the printed wiring board for a millimeter-wave radar according to the present invention, since being formed by using the resin composition of the present invention, have excellent dielectric characteristics of being low in both the relative dielectric constant and the dielectric loss tangent in a high-frequency region.

Further, in conventional resin films, in the case where no reinforcing base materials are blended in their resin compositions, it is likely that the handleability of the resin films becomes worse and the strength cannot also be sufficiently held. By contrast, by using the resin composition according to the present invention, even without having a reinforcing base material, there can also be fabricated a resin film excellent in appearance and handleability (tackiness, cracking, powder dropping and the like).

DESCRIPTION OF EMBODIMENTS

Figure 1:
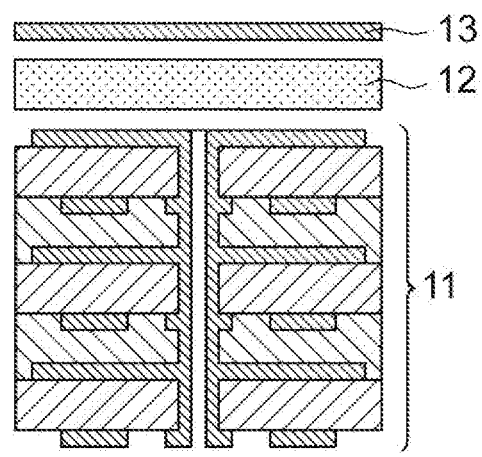
FIG. 1 is a schematic diagram illustrating a production step of a multilayered printed wiring board according to the present embodiment.
Figure 1:
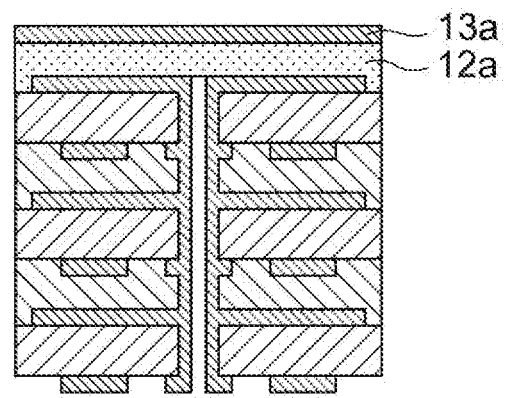
Figure 1:
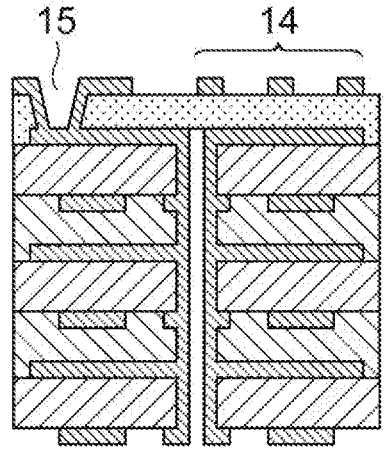

Hereinafter, a preferred embodiment of the present invention will be described. However, the present invention is not limited to the following embodiment. Here, in the present description, a "high-frequency region" refers to a region of 0.3 GHz to 300 GHz, and particularly a "frequency region to be used for a millimeter-wave radar" refers to 3 GHz to 300 GHz.

[Resin Composition]

A resin composition of the present embodiment comprises a compound having a maleimido group, a divalent group having at least two imido bonds and a saturated or unsaturated divalent hydrocarbon group.

<(A) Compound Having a Maleimido Group, a Divalent Group Having at Least Two Imido Bonds and a Saturated or Unsaturated Divalent Hydrocarbon Group>

A compound having an (a) maleimido group, a (b) divalent group having at least two imido bonds and a (c) saturated or unsaturated divalent hydrocarbon group according to the present embodiment is referred to as (A) component in some cases. Further, the (a) maleimido group is referred to as a structure (a); the (b) divalent group having at least two imido bonds, as a structure (b); and the (c) saturated or unsaturated divalent hydrocarbon group, as a structure (c), in some cases. By using the (A) component, there can be obtained a resin composition having high-frequency characteristics and high adhesiveness to conductors.

The (a) maleimido group is not especially limited, and is a common maleimido group. The (a) maleimido group may be bonded to an aromatic ring or an aliphatic chain, but from the viewpoint of dielectric characteristics, it is preferable that the (a) maleimido group be bonded to an aliphatic chain.

The (b) divalent group having at least two imido bonds is not especially limited, but examples thereof include a group represented by the following formula (I).

[Chemical Formula 12]

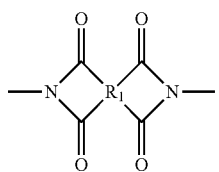

(I)

In the formula (I), $R_1$ represents a tetravalent organic group. $R_1$ is not especially limited as long as being a tetravalent organic group, but for example, from the viewpoint of the handleability, may be a hydrocarbon group having 1 to 100 carbon atoms, may be a hydrocarbon group having 2 to 50 carbon atoms, or may be a hydrocarbon group having 4 to 30 carbon atoms.

$R_1$ may be a substituted or nonsubstituted siloxane site. Examples of the siloxane site include structures originated from dimethylsiloxane, methylphenylsiloxane and diphenylsiloxane.

In the case where $R_1$ is substituted, examples of the substituent include an alkyl group, an alkenyl group, an alkynyl group, a hydroxyl group, an alkoxy group, a mercapto group, a cycloalkyl group, a substituted cycloalkyl group, a heterocycle group, a substituted heterocycle group, an aryl group, a substituted aryl group, a heteroaryl group, a substituted heteroaryl group, an aryloxy group, a substituted aryloxy group, a halogen atom, a haloalkyl group, a cyano group, a nitro group, a nitroso group, an amino group, an amido group, —C(O)H, —$NR_xC(O)$—N($R_x$)$_2$, —OC(O)—N($R_x$)$_2$, an acyl group, an oxyacyl group, a carboxyl group, a carbamate group and a sulfonamido group. Here, $R_x$ represents a hydrogen atom or an alkyl group. One or two or more of these substituents can be selected according to the purposes, the applications and the like.

As $R_1$, preferable is, for example, a tetravalent residue of an acid anhydride having two or more anhydride rings in one molecule thereof, that is, a tetravalent group made by eliminating two acid anhydride groups (—C(=O)OC(=O)—) from the acid anhydride. Examples of the acid anhydride include compounds as described later.

From the viewpoint of the mechanical strength, it is preferable that $R_1$ be aromatic, and it is more preferable that $R_1$ be a group made by eliminating two acid anhydride groups from pyromellitic anhydride. That is, it is more preferable that the structure (b) be a group represented by the following formula (III).

[Chemical Formula 13]

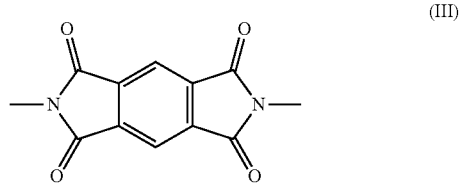

(III)

From the viewpoint of the flowability and the circuit embeddability, it is preferable that the structure (b) be present in plural numbers in the (A) component. In this case, the structures (b) may be identical or may be different. It is preferable that the number of the structures (b) in the (A) component be 2 to 40; being 2 to 20 is more preferable; and being 2 to 10 is still more preferable.

From the viewpoint of the dielectric characteristics, the structure (b) may be a group represented by the following formula (IV) or the following formula (V).

[Chemical Formula 14]

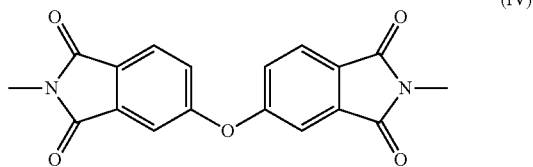

(IV)

[Chemical Formula 15]

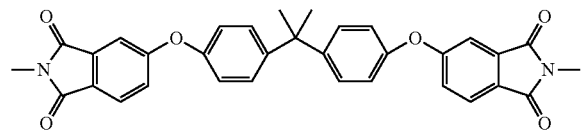

(V)

The structure (c) is not especially limited, and may be any of linear, branched or cyclic. Further the number of carbon atoms of the saturated or unsaturated divalent hydrocarbon group may also be 8 to 100. It is preferable that the structure (c) be an alkylene group which may have a branch having 8 to 100 carbon atoms; being an alkylene group which may have a branch having 10 to 70 carbon atoms is more preferable; and being an alkylene group which may have a branch having 15 to 50 carbon atoms is still more preferable.

When the (A) component has the structure (c), the flexibility of the resin composition according to the present embodiment is improved, and the handleability (tackiness, cracking, powder dropping and the like) and the strength of a resin film fabricated from the resin composition can be enhanced. Further the structure (c) having the above number of carbon atoms is preferable because the molecular structure is easily made to be of a three-dimensional one, and the density can be lowered, that is, the dielectric constant can be lowered, due to the increase in the free volume of the polymer.

Examples of the structure (c) include alkylene groups such as a nonylene group, a decylene group, an undecylene group, a dodecylene group, a tetradecylene group, a hexadecylene group, an octadecylene group and a nonadecylene group; arylene groups such as a benzylene group, a phenylene group and a naphthylene group; arylene alkylene groups such as a phenylene methylene group, a phenylene ethylene group, a benzylpropylene group, a naphthylene methylene group and a naphthylene ethylene group; and arylene dialkylene groups such as a phenylene dimethylene group and a phenylene diethylene group.

From the viewpoint of the high-frequency characteristics, the low-thermal expansion characteristics, the adhesiveness to conductors, the heat resistance and the low hygroscopic property, as the structure (c), the group represented by the following formula (II) is especially preferable.

[Chemical Formula 16]

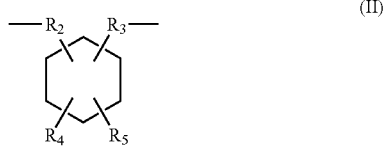

(II)

In the formula (II), $R_2$ and $R_3$ each independently represent an alkylene group having 4 to 50 carbon atoms. From the viewpoint of the further improvement of the flexibility and the easiness of the synthesis, it is preferable that $R_2$ and $R_3$ each independently be an alkylene group having 5 to 25 carbon atoms; being an alkylene group having 6 to 10 carbon atoms is more preferable; and being an alkylene group having 7 to 10 carbon atoms is still more preferable.

In the formula (II), $R_4$ represents an alkyl group having 4 to 50 carbon atoms. From the viewpoint of the further improvement of the flexibility and the easiness of the synthesis, it is preferable that $R_4$ be an alkyl group having 5 to 25 carbon atoms; being an alkyl group having 6 to 10 carbon atoms is more preferable; and being an alkyl group having 7 to 10 carbon atoms is still more preferable.

In the formula (II), $R_5$ represents an alkyl group having 2 to 50 carbon atoms. From the viewpoint of the further improvement of the flexibility and the easiness of the synthesis, it is preferable that $R_5$ be an alkyl group having 3 to 25 carbon atoms; being an alkyl group having 4 to 10 carbon atoms is more preferable; and being an alkyl group having 5 to 8 carbon atoms is still more preferable.

From the viewpoint of the flowability and the circuit embeddability, it is preferable that the structure (c) be present in plural numbers in the (A) component. In this case, the structures (c) may be identical or may be different. For example, it is preferable that 2 to 40 structures (c) be present in the (A) component; the presence of 2 to 20 structures (c) is more preferable; and the presence of 2 to 10 structures (c) is still more preferable.

The content of the (A) component in the resin composition is not especially limited. From the viewpoint of the heat resistance, the lower limit value of the content of the (A) component may be 2% by mass or higher or 10% by mass or higher to the total mass of the resin composition. Further from the viewpoint of the low thermal expansion coefficient, the upper limit value of the content of the (A) component may be 98% by mass or lower, 50% by mass or lower or 30% by mass or lower to the total mass of the resin composition. From the viewpoint of the heat resistance, it is preferable that the content of the (A) component be 2 to 98% by mass to the total mass of the resin composition; being 10 to 50% by mass is more preferable; and being 10 to 30% by mass is still more preferable.

The molecular weight of the (A) component is not especially limited. From the viewpoint of the flowability, the lower limit value of the weight-average molecular weight (Mw) of the (A) component may be 500 or higher, 1000 or higher, 1500 or higher, or 1700. Further from the viewpoint of the handleability, the upper limit value of Mw of the (A) component may be 10000 or lower, 9000 or lower, 7000 or lower, or 5000 or lower. From the viewpoint of the handleability, the flowability and the circuit embeddability, it is preferable that Mw of the (A) component be 500 to 10000; being 1000 to 9000 is more preferable; being 1500 to 9000 is still more preferable; being 1500 to 7000 is further still more preferable; and being 1700 to 5000 is especially preferable.

Mw of the (A) component can be measured by a gel permeation chromatography (GPC) method.

Here, the measurement condition of GPC is as follows.
Pump: L-6200 type [manufactured by Hitachi High-Technologies Corp.]
Detector: L-3300 type RI [manufactured by Hitachi High-Technologies Corp.]
Column oven: L-655A-52 [manufactured by Hitachi High-Technologies Corp.]
Guard column and columns: TSK Guardcolumn HHR-L+TSKgel G4000HHR+TSKgel G2000HHR [all, manufactured by Tosoh Corp., trade name]
Column size: 6.0×40 mm (guard column), 7.8×300 mm (columns)
Eluate: tetrahydrofuran
Specimen concentration: 30 mg/5 mL
Injection volume: 20 µL
Flow volume: 1.00 mL/min
Measurement temperature: 40° C.

A method for producing the (A) component is not limited. The (A) component may be fabricated, for example, by reacting an acid anhydride with a diamine to thereby synthesize an amine-terminated compound, and thereafter reacting the amine-terminated compound with an excessive amount of maleic anhydride.

Examples of the acid anhydride include pyromellitic anhydride, maleic anhydride, succinic anhydride, 3,3',4,4'-benzophenonetetracarboxylic dianhydride, 3,3',4,4'-biphenyltetracarboxylic dianhydride and 3,3',4,4'-diphenylsulfonetetracarboxylic dianhydride. These acid anhydrides may be used singly or in combinations of two or more according to the purposes, applications and the like. Here, as described above, As $R_1$ of the above formula (I), there can be used tetravalent organic groups originated from acid anhydrides as cited in the above. From the viewpoint of better dielectric characteristics, it is preferable that the acid anhydride be pyromellitic anhydride.

Examples of the diamine include dimer diamines, 2,2-bis (4-(4-aminophenoxy)phenyl)propane, 1,3-bis(4-aminophenoxy)benzene, 4,4'-bis(4-aminophenoxy)biphenyl, 4,4'-diamino-3,3'-dihydroxybiphenyl, 1,3-bis[(2-(4-aminophenyl)-2-propyl]benzene, 1,4-bis[(2-(4-aminophenyl)-2-propyl]benzene, polyoxyalkylenediamines, and [3,4-bis(1-aminoheptyl)-6-hexyl-5-(1-octenyl)]cyclohexene. These may be used singly or in combinations of two or more according to the purposes, applications and the like.

The (A) component may be, for example, the following compound.

[Chemical Formula 17]

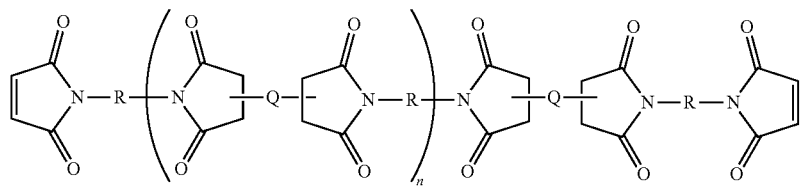

In the formula, R and Q each independently represent a divalent organic group. As R, a group having the same structure as the above-mentioned structure (c) can be used, and as Q, the same group as the above-mentioned $R_1$ can be used. n represents an integer of 1 to 10.

As the (A) component, commercially available compounds can also be used. Examples of commercially available compounds include products manufactured by Designer Molecules Inc., and specifically include BMI-1500, BMI-1700, BMI-3000, BMI-5000 and BMI-9000 (any of which is a trade name). From the viewpoint of acquiring better high-frequency characteristics, it is more preferable that as the (A) component, BMI-3000 be used.

<(B) Maleimido Group-Containing Compound>

The resin composition of the present embodiment can further comprise a maleimido group-containing compound different from the (A) component. The maleimido group-containing compound is referred to as (B) component in some cases. Here, compounds capable of corresponding to both of the (A) component and the (B) maleimido group-containing compound are determined to belong to the (A) component. By using the (B) component, the resin composition becomes one excellent particularly in the low thermal expansion characteristics. That is, the resin composition of the present embodiment, by using the (A) component and the (B) component in combination, can be further improved in the low thermal expansion characteristics and the like while retaining good dielectric characteristics. It is presumed that the reason therefor is because a cured substance obtained from the resin composition containing the (A) component and the (B) component contains a polymer having a structural unit consisting of the (A) component, which has low dielectric characteristics, and a structural unit consisting of the (B) maleimido group-containing compound, which is low in the thermal expansion.

That is, it is preferable that the (B) maleimido group-containing compound have a lower thermal expansion coefficient than the (A) component. Examples of the (B) component having a lower thermal expansion coefficient than the (A) component include maleimido group-containing compounds having a lower molecular weight than the (A) component, maleimido group-containing compounds having more aromatic rings than the (A) component, and maleimido group-containing compounds having a shorter main chain than the (A) component.

The content of the (B) component in the resin composition is not especially limited. From the viewpoint of the low thermal expansion property, the lower limit value of the content of the (B) component may be 1% by mass or higher, 3% by mass or higher or 5% by mass or higher to the total mass of the resin composition. Further from the viewpoint of the dielectric characteristics, the upper limit value of the (B) component may be 95% by mass or lower, 90% by mass or lower, or 85% by mass or lower to the total mass of the resin composition. From the viewpoint of the low thermal expansion property, it is preferable that the content of the (B) component be 1 to 95% by mass to the total mass of the resin composition; being 3 to 90% by mass is more preferable; and being 5 to 85% by mass is still more preferable.

The blend proportion of the (A) component and the (B) component in the resin composition is not especially limited. From the viewpoint of the dielectric characteristics and the low thermal expansion coefficient, it is preferable that the mass ratio ((B)/(A)) of the (A) component and the (B) component be 0.01 to 3; being 0.03 to 2 is more preferable; and being 0.05 to 1 is still more preferable.

The (B) maleimido group-containing compound is not especially limited, but it is preferable that the (B) maleimido group-containing compound have an aromatic ring. Since the aromatic ring is rigid and low in the thermal expansion, by using the (B) component having an aromatic ring, the thermal expansion coefficient can further be reduced. Although the maleimido group may be bonded to an aromatic ring or an aliphatic chain, from the viewpoint of the dielectric characteristics, it is preferable that the maleimido group be bonded to an aromatic ring. That is, it is preferable that the (B) component have a group in which a maleimido group is bonded to an aromatic ring. Further it is also preferable that the (B) component be a polymaleimide compound containing two or more maleimido groups.

Specific examples of the (B) component include 1,2-dimaleimidoethane, 1,3-dimaleimidopropane, bis(4-maleimidophenyl)methane, bis(3-ethyl-4-maleimidophenyl)methane, bis(3-ethyl-5-methyl-4-maleimidophenyl)methane, 2,7-dimaleimidofluorene, N,N'-(1,3-phenylene)bismaleimide, N,N'-(1,3-(4-methylphenylene))bismaleimide, bis(4-maleimidophenyl) sulfone, bis(4-maleimidophenyl) sulfide, bis(4-maleimidophenyl) ether, 1,3-bis(3-maleimidophenoxy)benzene, 1,3-bis(3-(3-maleimidophenoxy)phenoxy)benzene, bis(4-maleimidophenyl) ketone, 2,2-bis(4-(4-maleimidophenoxy)phenyl)propane, bis(4-(4-maleimidophenoxy)phenyl) sulfone, bis[4-(4-maleimidophenoxy)phenyl] sulfoxide, 4,4'-bis(3-maleimidophenoxy)biphenyl, 1,3-bis(2-(3-maleimidophenyl)propyl)benzene, 1,3-bis(1-(4-(3-maleimidophenoxy)phenyl)-1-propyl)benzene, bis(maleimidocyclohexyl)methane, 2,2-bis[4-(3-maleimidophenoxy)phenyl]-1,1,1,3,3,3-hexafluoropropane, and bis(maleimidophenyl)thiophene. These may be used singly or in combinations of two or more. Among these, from the viewpoint of more reducing the hygroscopic property and the thermal expansion coefficient, it is preferable to use bis(3-ethyl-5-methyl-4-maleimidophenyl)methane. From the viewpoint of further enhancing the breaking strength of a resin film formed from the resin composition and the metal foil peel strength, as the (B) component, it is preferable to use 2,2-bis(4-(4-maleimidophenoxy)phenyl)propane.

From the viewpoint of the moldability, it is preferable that the (B) maleimido group-containing compound be, for example, a compound represented by the following formula (VI).

[Chemical Formula 18]

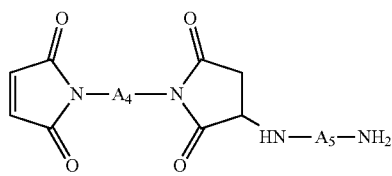

(VI)

In the formula (VI), $A_4$ represents a residue represented by the following formula (VII), (VIII), (IX) or (X); and $A_5$ represents a residue represented by the following formula (XI).

[Chemical Formula 19]

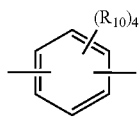

(VII)

In the formula (VII), $R_{10}$ each independently represent a hydrogen atom, an aliphatic hydrocarbon group having 1 to 5 carbon atoms or a halogen atom.

[Chemical Formula 20]

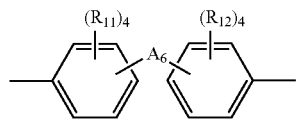

(VIII)

In the formula (VIII), $R_{11}$ and $R_{12}$ each independently represent a hydrogen atom, an aliphatic hydrocarbon group having 1 to 5 carbon atoms or a halogen atom; and $A_6$ represents an alkylene group or an alkylidene group having 1 to 5 carbon atoms, an ether group, a sulfide group, a sulfonyl group, a ketone group, a single bond or a residue represented by the following formula (VIII-1).

[Chemical Formula 21]

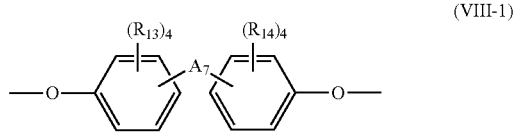

(VIII-1)

In the formula (VIII-1), $R_{13}$ and $R_{14}$ each independently represent a hydrogen atom, an aliphatic hydrocarbon group having 1 to 5 carbon atoms or a halogen atom; and $A_7$ represents an alkylene group having 1 to 5 carbon atoms, an isopropylidene group, an ether group, a sulfide group, a sulfonyl group, a ketone group or a single bond.

[Chemical Formula 22]

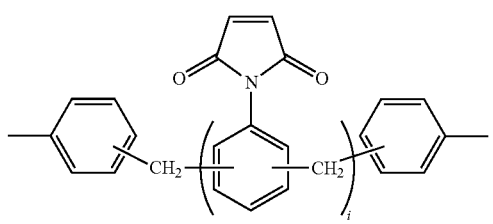

(IX)

In the formula (IX), i is an integer of 1 to 10.

[Chemical Formula 23]

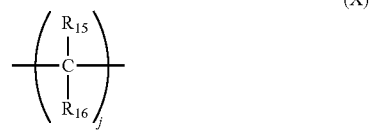

(X)

In the formula (X), $R_{15}$ and $R_{16}$ each independently represent a hydrogen atom or an aliphatic hydrocarbon group having 1 to 5 carbon atoms; and j is an integer of 1 to 8.

[Chemical Formula 24]

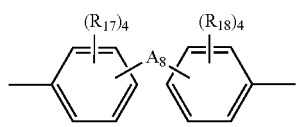

(XI)

In the formula (XI), $R_{17}$ and $R_{18}$ each independently represent a hydrogen atom, an aliphatic hydrocarbon group having 1 to 5 carbon atoms, an alkoxy group having 1 to 5 carbon atoms, a hydroxyl group or a halogen atom; and $A_8$ represents an alkylene group or an alkylidene group having 1 to 5 carbon atoms, an ether group, a sulfide group, a sulfonyl group, a ketone group, a fluorenylene group, a single bond, a residue represented by the following formula (XI-1) or a residue represented by the following formula (XI-2).

[Chemical Formula 25]

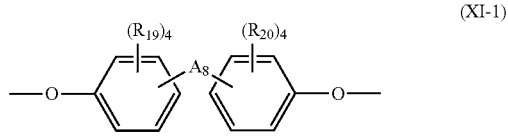

(XI-1)

In the formula (XI-1), $R_{19}$ and $R_{20}$ each independently represent a hydrogen atom, an aliphatic hydrocarbon group having 1 to 5 carbon atoms or a halogen atom; and $A_9$ represents an alkylene group having 1 to 5 carbon atoms, an isopropylidene group, a m-phenylenediisopropylidene group, a p-phenylenediisopropylidene group, an ether group, a sulfide group, a sulfonyl group, a ketone group or a single bond.

[Chemical Formula 26]

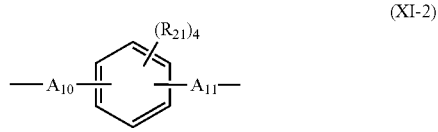

(XI-2)

In the formula (XI-2), $R_{21}$ each independently represent a hydrogen atom, an aliphatic hydrocarbon group having 1 to 5 carbon atoms or a halogen atom; and $A_{10}$ and $A_{11}$ each independently represent an alkylene group having 1 to 5 carbon atoms, an isopropylidene group, an ether group, a sulfide group, a sulfonyl group, a ketone group or a single bond.

It is preferable, from the viewpoint of the solubility to organic solvents, the high-frequency characteristics and the high adhesiveness to conductors, that the (B) maleimido group-containing compound be used as a polyaminobismaleimide compound. The polyaminobismaleimide compound can be obtained, for example, by subjecting a compound having two maleimido groups on terminals thereof and an aromatic diamine compound having two primary amino groups in the molecule to a Michael addition reaction in an organic solvent.

The aromatic diamine compound having two primary amino groups in the molecule is not especially limited, but examples thereof include 4,4'-diaminodiphenylmethane, 4,4'-diamino-3,3'-dimethyl-diphenylmethane, 2,2'-dimethyl-4,4'-diaminobiphenyl, 2,2-bis(4-(4-aminophenoxy)phenyl)propane, 4,4'-[1,3-phenylenebis(1-methylethylidene)]bisaniline, and 4,4'-[1,4-phenylenebis(1-methylethylidene)]bisaniline. These may be used singly or in combinations of two or more.

Further from the viewpoint of the solubility to organic solvents being high, the reaction ratio in the synthesis being high, and the heat resistance being capable of being raised, 4,4'-diaminodiphenylmethane and 4,4'-diamino-3,3'-dimethyl-diphenylmethane are preferable. These may be used singly or in combinations of two or more according to the purposes, applications and the like.

An organic solvent to be used when the polyaminobismaleimide compound is produced is not especially limited, but examples thereof include alcohols such as methanol, ethanol, butanol, butyl cellosolve, ethylene glycol monomethyl ether and propylene glycol monomethyl ether; ketones such as acetone, methyl ethyl ketone, methyl isobutyl ketone and cyclohexanone; aromatic hydrocarbons such as toluene, xylene and mesitylene; esters such as methoxyethyl acetate, ethoxyethyl acetate, butoxyethyl acetate and ethyl acetate; and nitrogen-containing compounds such as N,N-dimethylformamide, N,N-dimethylacetamide and N-methyl-2-pyrrolidone. These may be used singly or as a mixture of two or more. Among these, methyl ethyl ketone, cyclohexanone, propylene glycol monomethyl ether, N,N-dimethylformamide and N,N-dimethylacetamide are preferable from the viewpoint of the solubility.

(Catalyst)

The resin composition of the present embodiment may further comprise a catalyst to promote curing of the (A) component. The content of the catalyst is not especially limited, but may be 0.1 to 5% by mass to the total mass of the resin composition. As the catalyst, there can be used, for example, peroxides and azo compounds.

Examples of the peroxide include dicumyl peroxide, dibenzoyl peroxide, 2-butanone peroxide, tert-butyl perbenzoate, di-tert-butyl peroxide, 2,5-dimethyl-2,5-di(t-butylperoxy)hexane, bis(tert-butylperoxyisopropyl)benzene and tert-butyl hydroperoxide. Examples of the azo compound include 2,2'-azobis(2-methylpropanenitrile), 2,2'-azobis(2-methylbutanenitrile) and 1,1'-azobis(cyclohexanecarbonitrile).

<(C) Thermosetting Resin>

The resin composition of the present embodiment can further comprise a thermosetting resin different from the (A) component and the (B) component. Here, compounds capable of corresponding to the (A) component or the (B) component are determined not to belong to the (C) thermosetting resin. Examples of the (C) thermosetting resin include epoxy resins and cyanate ester resins. When the (C) thermosetting resin is contained, the low thermal expansion characteristics and the like of the resin composition can further be improved.

In the case where as the (C) thermosetting resin, an epoxy resin is contained, the epoxy resin is not especially limited, but examples thereof include bisphenol A epoxy resins, bisphenol F epoxy resins, bisphenol S epoxy resins, alicyclic epoxy resins, aliphatic chain epoxy resins, phenol novolac epoxy resins, cresol novolac epoxy resins, bisphenol A novolac epoxy resins, phenol aralkyl epoxy resins, naphthalene skeleton-containing epoxy resins such as naphthol novolac epoxy resins and naphthol aralkyl epoxy resins, bifunctional biphenyl epoxy resins, biphenyl aralkyl epoxy resins, dicyclopentadiene epoxy resins and dihydroanthracene epoxy resins. These may be used singly or in combinations of two or more. Among these, from the viewpoint of the high-frequency characteristics and the thermal expansion characteristics, it is preferable to use a naphthalene skeleton-containing epoxy resin or a biphenyl aralkyl epoxy resin.

In the case where as the (C) thermosetting resin, a cyanate ester resin is contained, the cyanate ester resin is not especially limited, but examples thereof include 2,2-bis(4-cyanatophenyl)propane, bis(4-cyanatophenyl)ethane, bis(3,5-dimethyl-4-cyanatophenyl)methane, 2,2-bis(4-cyanatophenyl)-1,1,1,3,3,3-hexafluoropropane, α,α'-bis(4-cyanatophenyl)-m-diisopropylbenzene, cyanate ester compounds of phenol-added dicyclopentadiene polymers, phenol novolac cyanate ester compounds, and cresol novolac cyanate ester compounds. These may be used singly or in combinations of two or more. Among these, in consideration of the inexpensiveness and the overall balance of the high-frequency characteristics and other characteristics, it is preferable to use 2,2-bis(4-cyanatophenyl)propane.

(Curing Agent)

The resin composition of the present embodiment may further comprise a curing agent of the (C) thermosetting resin. Thereby, a reaction when a cured substance of the resin composition is obtained can smoothly be advanced, and the physical properties of the obtained cured substance of the resin composition are enabled to be suitably regulated.

In the case of using an epoxy resin, a curing agent is not especially limited, but examples thereof include polyamine compounds such as diethylenetriamine, triethylenetetramine, diaminodiphenylmethane, m-phenylenediamine and dicyandiamide; polyphenol compounds such as bisphenol A, phenol novolac resins, cresol novolac resins, bisphenol A novolac resins and phenol aralkyl resins; acid anhydrides such as phthalic anhydride and pyromellitic anhydride; various carboxylic acid compounds; and various active ester compounds.

In the case of using a cyanate ester resin, a curing agent is not especially limited, but examples thereof include various monophenol compounds, various polyphenol compounds, various amine compounds, various alcohol compounds, various acid anhydrides and various carboxylic acid compounds. These may be used singly or in combinations of two or more.

(Curing Accelerator)

The resin composition of the present embodiment may further be blended with a curing accelerator according to the kind of the (C) thermosetting resin. Examples of a curing accelerator of the epoxy resin include various types of imidazoles, $BF_3$ amine complexes and phosphorus-containing curing accelerators, which are latent heat curing agents. In the case of blending a curing accelerator, from the viewpoint of the storage stability of the resin composition, and the handleability and the solder heat resistance of the semicured resin composition, imidazoles and phosphorus-containing curing accelerators are preferable.

(Inorganic Filler)

The resin composition of the present embodiment may further comprise an inorganic filler. When optional suitable inorganic fillers are contained, there can be improved the low thermal expansion characteristics, the high elastic modulus property, the heat resistance, the flame retardancy and the like of the resin composition. The inorganic filler is not especially limited, but examples thereof include silica, alumina, titanium oxide, mica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, calcined clay, talc, aluminum borate, and silicon carbide. These may be used singly or in combinations of two or more.

The shape and the particle diameter of the inorganic filler are not especially limited, and the particle diameter of the inorganic filler may be, for example, 0.01 to 20 μm or 0.1 to 10 μm. Here, the particle diameter refers to an average particle diameter, and is a particle diameter at the point corresponding to 50% in volume when a cumulative frequency distribution curve of particle diameters is determined with the total volume of the particles being taken to be 100%. The average particle diameter can be measured by a particle size distribution analyzer using a laser diffraction scattering method, or the like.

In the case of using an inorganic filler, the use volume thereof is not especially limited, but it is preferable, for example, that the content ratio of the inorganic filler be 3 to 75% by volume with respect to the total volume of the solid content in the resin composition; and being 5 to 70% by volume is more preferable. In the case where the content ratio of the inorganic filler in the resin composition is in the above range, it becomes easy for the good curability, moldability and chemical resistance to be attained.

In the case of using an inorganic filler, for the purpose of improving the dispersibility of the inorganic filler, the close adhesiveness to organic components, and the like, as required, a coupling agent can be used concurrently. The coupling agent is not especially limited, and there can be used, for example, various types of silane coupling agents, and titanate coupling agents. These may be used singly or in combinations of two or more. The amount used of the coupling agent also is not especially limited, and may be made to be, with respect to 100 parts by mass of the inorganic filler to be used, 0.1 to 5 parts by mass or 0.5 to 3 parts by mass, for example. When the amount thereof used is in this range, decreases in various characteristics are small and it becomes easy for advantages by use of the inorganic filler to be effectively exhibited.

In the case of using a coupling agent, although the so-called integral blending system may be used in which after an inorganic filler is blended in the resin composition, the coupling agent is added, it is preferable to use a system in which there is used an inorganic filler previously surface-treated in dry or wet with the coupling agent. By using this method, advantages of the above inorganic filler can be developed more effectively.

(Thermoplastic Resin)

The resin composition of the present embodiment, from the viewpoint of raising the handleability of the resin film, may further comprise a thermoplastic resin. The kind of the thermoplastic resin is not especially limited, and the molecular weight also is not limited, but from the viewpoint of enhancing the compatibility with the (A) component, it is preferable that the number-average molecular weight (Mn) be 200 to 60000.

From the viewpoint of the film formability and the hygroscopic resistance, it is preferable that the thermoplastic resin be a thermoplastic elastomer. The thermoplastic elastomer includes saturated thermoplastic elastomers; and the saturated thermoplastic elastomers include chemically modified saturated thermoplastic elastomers and non-modified saturated thermoplastic elastomers. The chemically modified saturated thermoplastic elastomers include styrene-ethylene-butylene copolymers modified with maleic anhydride. Specific examples of the chemically modified saturated thermoplastic elastomers include Tuftec M1911, M1913 and M1943 (all, manufactured by Asahi Kasei Chemicals Corp., trade names). On the other hand, the non-modified saturated thermoplastic elastomers include non-modified styrene-ethylene-butylene copolymers. Specific examples of the non-modified saturated thermoplastic elastomers include Tuftec H1041, H1051, H1043 and H1053 (all, manufactured by Asahi Kasei Chemicals Corp., trade names).

From the viewpoint of the film formability, the dielectric characteristics and the hygroscopic resistance, it is more preferable that the saturated thermoplastic elastomer have a styrene unit in the molecule. Here, in the present description, the "styrene unit" refers to a unit originated from a styrene monomer in a polymer; and the "saturated thermoplastic elastomer" refers to one having a structure in which any aliphatic hydrocarbon moieties other than aromatic hydrocarbon moieties in the styrene unit are constituted of saturated bonding groups.

The content ratio of the styrene unit in the saturated thermoplastic elastomer is not especially limited, but it is preferable that the content ratio be 10 to 80% by mass in mass percentage of the styrene unit to the total mass of the saturated thermoplastic elastomer; and being 20 to 70% by mass is more preferable. When the content ratio of the styrene unit is in the above range, the saturated thermoplastic elastomer is likely to be excellent in the film appearance, the heat resistance and the adhesiveness.

Specific examples of the saturated thermoplastic elastomer having the styrene unit in the molecule include styrene-ethylene-butylene copolymers. The styrene-ethylene-butylene copolymers can be obtained, for example, by carrying out hydrogenation on unsaturated double bonds which structural units originated from butadiene of a styrene-butadiene copolymer have.

The content of the thermoplastic resin is not especially limited, but from the viewpoint of making the dielectric characteristics better, it is preferable that the content be 0.1 to 15% by mass to the total mass of the solid content of the resin composition; being 0.3 to 10% by mass is more preferable; and being 0.5 to 5% by mass is still more preferable.

(Flame Retardant)

The resin composition of the present embodiment may further be blended with a flame retardant. The flame retardant is not especially limited, but there are suitably used bromine-based flame retardants, phosphorus-based flame retardants, metal hydroxides, and the like. The bromine-based flame retardants include brominated epoxy resins such as brominated bisphenol A epoxy resins and brominated phenol novolac epoxy resins; bromination addition-type flame retardants such as hexabromobenzene, pentabromotoluene, ethylenebis(pentabromophenyl), ethylenebistetrabromophthalimide, 1,2-dibromo-4-(1,2-dibromoethyl)cyclohexane, tetrabromocyclooctane, hexabromocyclododecane, bis(tribromophenoxy)ethane, brominated polyphenylene ethers, brominated polystyrenes and 2,4,6-tris(tribromophenoxy)-1,3,5-triazine; and bromination reaction-type flame retardants containing an unsaturated double bond group such as tribromophenylmaleimide, tribromophenyl acrylate, tribromophenyl methacrylate, tetrabromobisphenol A dimethacrylate, pentabromobenzyl acrylate, and brominated styrene. These flame retardants may be used singly or in combinations of two or more.

The phosphorus-based flame retardants include aromatic phosphate esters such as triphenyl phosphate, tricresyl phosphate, trixylenyl phosphate, cresyl diphenyl phosphate, cresyl di-2,6-xylenyl phosphate and resorcinol bis(diphenylphosphate); phosphonate esters such as divinyl phenylphosphonate, diallyl phenylphosphonate and bis(1-butenyl) phenylphosphonate; phosphinate esters such as phenyl diphenylphosphinate, methyl diphenylphosphinate and 9,10-dihydro-9-oxa-10-phosphaphenanthrene-10-oxide derivatives; phosphazene compounds such as bis(2-allylphenoxy)phosphazene and dicresylphosphazene; and other phosphorus-based flame retardants such as melamine phosphate, melamine pyrophosphate, melamine polyphosphate, melam polyphosphate, ammonium polyphosphate, phosphorus-containing vinylbenzyl compounds and red phosphorus. The metal hydroxide flame retardants include magnesium hydroxide and aluminum hydroxide. These flame retardants may be used singly or in combinations of two or more.

The resin composition of the present embodiment can be obtained by homogeneously dispersing and mixing the above-mentioned respective components; and its preparation means, conditions and the like are not especially limited. Examples of the preparation means include a method in which the respective components in predetermined amounts blended are fully and homogeneously stirred and mixed by a mixer or the like, and thereafter kneaded by using a mixing roll, an extrusion machine, a kneader, a roll, an extruder, or the like; and further, the obtained kneaded material is cooled and crushed. Here, also the kneading form is not especially limited.

The relative dielectric constant of a cured substance of the resin composition of the present embodiment is not especially limited, but from the viewpoint of being suitably used in a high-frequency band, it is preferable that the relative dielectric constant at 10 GHz be 3.6 or lower; being 3.1 or lower is more preferable; and being 3.0 or lower is still more preferable. The lower limit of the relative dielectric constant is not especially limited, but may be, for example, about 1.0. Further from the viewpoint of being suitably used in a high-frequency band, it is preferable that the dielectric loss tangent of a cured substance of the resin composition of the present embodiment be 0.004 or lower; and being 0.003 or lower is more preferable. The lower limit of the relative dielectric constant is not especially limited, but may be, for example, about 0.0001. The relative dielectric constant and the dielectric loss tangent can be measured by methods shown in the below Examples.

From the viewpoint of suppressing warpage of the laminate, it is preferable that the thermal expansion coefficient of a cured substance of the resin composition of the present embodiment be 10 to 90 ppm/° C.; being 10 to 45 ppm/° C. is more preferable; and being 10 to 40 ppm/° C. is still more preferable. The thermal expansion coefficient can be measured according to IPC-TM-650 2.4.24.

[Support with a Resin Layer]

In the present embodiment, a resin film can be produced by using the above-mentioned resin composition. Here, the resin film refers to an uncured or semicured filmy resin composition.

A production method of the resin film is not limited, but the resin film can be obtained, for example, by drying a resin layer formed by applying the resin composition on a support base material. Specifically, the resin composition is applied on a support base material by using a kiss coater, a roll coater, a comma coater or the like, and thereafter, may be dried in a heating dryer or the like, for example, at a temperature of 70 to 250° C., preferably 70 to 200° C., for 1 to 30 min, preferably 3 to 15 min. Thereby, there can be obtained the resin film in the state that the resin composition is semicured.

Here, the resin film in the state of being semicured can be heat-cured by being further heated by a heating oven, for example, at a temperature of 170 to 250° C., preferably 185 to 230° C., for 60 to 150 min.

The thickness of the resin film according to the present embodiment is not especially limited, but it is preferable that the thickness be 1 to 200 μm; being 2 to 180 μm is more preferable; and being 3 to 150 μm is still more preferable. When the thickness of the resin film is made to be in the above range, there are easily satisfied simultaneously both the thickness reduction and the good high-frequency characteristics of a printed wiring board obtained by using the resin film according to the present embodiment.

The support base material is not especially limited, but it is preferable that the support base material be at least one selected from the group consisting of glasses, metal foils and PET films. When the resin film has the support base material, the storage property and the handleability in production use of a printed wiring board are likely to become good. That is, the resin film according to the present embodiment can take a form of a support with a resin layer which has a resin layer containing the resin composition of the present embodiment and the support base material, and the resin layer may be peeled off the support base material when the resin film is used.

[Prepreg]

A prepreg of the present embodiment is constituted of the above-mentioned resin composition and a fiber base material.

The prepreg of the present embodiment can be obtained, for example, by coating the resin composition of the present embodiment on the fiber base material being a reinforcing base material, and drying the coated resin composition. Further the prepreg of the present embodiment may be obtained by impregnating the fiber base material with the resin composition of the present embodiment, and thereafter drying the impregnated resin composition. Specifically, the prepreg in which the resin composition is semicured is obtained by drying the fiber base material on which the resin composition adheres in a drying oven usually at a temperature of 80 to 200° C. for 1 to 30 min. With respect to the amount of the resin composition adhering on the fiber base material, from the viewpoint of the good moldability, it is preferable that the resin composition be coated or impregnated so that the resin content ratio in the prepreg after the drying becomes 30 to 90% by mass.

The fiber base material is not limited, but a sheet-form fiber base material is preferable. As the sheet-form fiber base material, there are used, for example, well-known ones being used for various types of laminates for electric insulating materials. Examples of materials therefor include inorganic fibers of E glass, NE glass, S glass, Q glass or the like; and organic fibers of polyimide, polyester, tetrafluoroethylene or the like. As the sheet-form fiber base material, there can be used ones having a shape of woven fabric, nonwoven fabric, chopped strand mat or the like. Further the thickness of the sheet-form fiber base material is not especially limited, and the sheet-form fiber base materials of, for example, 0.02 to 0.5 mm can be used. Further as the sheet-form fiber base material, ones having been subjected to a surface treatment with a coupling agent or the like, or having been subjected to a mechanical fiber opening treatment are preferable from the viewpoint of the impregnatability of the resin composition, and the heat resistance, hygroscopic resistance and processability of a laminate when the fiber base material is made into the laminate.

[Laminate]

According to the present embodiment, there can be provided a laminate having a resin layer containing a cured substance of the above-mentioned resin composition, and a conductor layer. For example, a metal-clad laminate can be produced by using the resin film, the support with a resin layer, or the prepreg.

A production method of the metal-clad laminate is not limited, but a metal-clad laminate having a metal foil on at least one surface of the resin layer or the prepreg to become an insulating layer can be obtained, for example, by disposing the metal foil to become a conductor layer on at least one surface of one sheet or a plurality of stacked sheets of the resin film or the prepreg of the present embodiment, and heating and pressing the resultant, for example, at a temperature of 170 to 250° C., preferably 185 to 230° C., and at a pressure of 0.5 to 5.0 MPa for 60 to 150 min. The heating and pressing can be carried out, for example, under the condition of a degree of vacuum of 10 kPa or lower, preferably 5 kPa or lower, and from the viewpoint of enhancing the efficiency, it is preferable that the heating and pressing be carried out in vacuum. It is preferable that the heating and pressing be carried out for 30 min from the starting time to until the molding-finishing time therefrom.

[Multilayered Printed Wiring Board]

According to the present embodiment, there can be provided a multilayered printed wiring board having a resin layer containing a cured substance of the above-mentioned resin composition, and at least three layers of circuit layers. The upper limit value of the number of circuit layers is not especially limited, and may be 3 layers to 20 layers. A multilayered printed wiring board can also be produced, for example, by using the above-mentioned resin film, support with a resin layer, prepreg or metal-clad laminate.

A production method of a multilayered printed wiring board is not especially limited, but a multilayered printed wiring board can be produced, for example, by first disposing the resin film on one surface or both surfaces of a core substrate having been subjected to a circuit formation processing or disposing the resin film between a plurality of core substrates, subjecting the resultant to pressing and heating lamination molding or pressing and heating press molding to adhere the each layer, and thereafter subjecting the resultant to a circuit formation processing by laser boring processing, drill boring processing, metal plating processing, metal etching processing or the like. In the case where the resin film has a support base material (in the case where the support with a resin layer is used), the support base material can be peeled off in advance before the resin film is disposed on a core substrate or between core substrates, or be peeled off after the resin layer is laminated on the core substrate.

A production method of a multilayered printed wiring board using the resin film according to the present embodiment will be described by way of FIG. 1. FIG. 1 is a diagram schematically illustrating production steps of the multilayered printed wiring board according to the present embodiment. The production method of the multilayered printed wiring board according to the present embodiment comprises (a) a step (hereinafter, referred to as "step (a)") of laminating a resin film on an inner layer circuit board to form a resin layer, (b) a step (hereinafter, referred to as "step (b)") of heating and pressing the resin layer to cure the resin layer, and (c) a step (hereinafter, referred to as "step (c)") of forming an antenna circuit layer on the cured resin layer.

As illustrated in FIG. 1(a), in the step (a), a resin film 12 according to the present embodiment is laminated on an inner layer circuit board 11 to thereby form a resin layer consisting of the resin film 12.

A lamination method is not especially limited, but examples thereof include a method of laminating by using a multi-daylight press, a vacuum press, an atmospheric laminator or a laminator which performs heating and pressing under vacuum, and preferable is a method using the laminator which performs heating and pressing under vacuum. Thereby, even if the inner layer circuit board 11 has fine wiring circuits on its surface, spaces between the circuits can be embedded in the resin without producing voids. The lamination condition is not especially limited, but it is preferable that the lamination be carried out at a pressure bonding temperature of 70 to 130° C. and a pressure bonding pressure of 1 to 11 kgf/cm$^2$, and under reduced pressure or under vacuum. The lamination may be carried out in a batch system or a continuous system using rolls.

The inner layer circuit board 11 can use, without being especially limited, a glass epoxy substrate, a metal substrate, a polyester substrate, a polyimide substrate, a BT resin substrate, a thermosetting polyphenylene ether substrate, or the like. The circuit surface on the surface side of the inner layer circuit board 11 on which the resin film is to be laminated may be previously subjected to a roughening treatment.

The number of circuit layers of the inner layer circuit board 11 is not limited. FIG. 1 illustrates an inner layer circuit board having 6 layers, but the number thereof is not limited to this number of layers; for example, in the case of fabricating a printed wiring board for a millimeter-wave radar, the number thereof can optionally be selected from 2 layers to 20 layers or so according to the design concerned. The multilayered printed wiring board of the present embodiment can be applied to fabrication of a millimeter-wave radar. That is, there can be fabricated a printed wiring board for a millimeter-wave radar which has a resin layer containing a cured substance of the resin composition of the present embodiment, and a circuit layer.

In the case where an antenna circuit layer 14 described later is formed on a resin layer 12a by etching, a metal foil 13 may further be laminated on the resin film 12 to form a metal layer 13a. Examples of the metal foil include copper, aluminum, nickel and zinc, and from the viewpoint of the conductivity, copper is preferable. The metal foil may be an alloy, and examples of copper alloys include high-purity copper alloys in which a small amount of beryllium or cadmium is added. It is preferable that the thickness of the metal foil be 3 to 200 μm; and being 5 to 70 μm is more preferable.

As illustrated in FIG. 1(b), in the step (b), the inner layer circuit board 11 and the resin layer 12a laminated in the step (a) are heated and pressed to be heat-cured. The condition is not especially limited, but it is preferable that the condition be in the ranges of a temperature of 100° C. to 250° C., a pressure of 0.2 to 10 MPa and a time of 30 to 120 min; and being 150° C. to 220° C. is more preferable.

As illustrated in FIG. 1(c), in the step (c), the antenna circuit layer 14 is formed on the resin layer 12a. A formation method of the antenna circuit layer 14 is not especially limited, and the antenna circuit layer 14 may be formed, for example, by an etching process such as a subtractive process or a semi-additive process.

The subtractive process is a process of forming a desired circuit by forming an etching resist layer having a shape corresponding to a desired pattern shape on the metal layer 13a, and in a developing process thereafter, dissolving and removing the metal layer in portions where the resist is removed by using a chemical. As the chemical, there can be used, for example, a copper chloride solution or an iron chloride solution.

The semi-additive process is a process of forming a desired circuit layer by forming a metal film on the surface of the resin layer 12a by an electroless plating method, forming a plating resist layer having a shape corresponding to a desired pattern on the metal film, then forming a metal layer by an electroplating method, and thereafter removing an unnecessary electrolessly plated layer by using a chemical or the like.

Further in the resin layer 12a, as required, holes such as a via hole 15 may be formed. A formation method of the hole is not limited, but there can be applied an NC drill, a carbon dioxide laser, a UV laser, a YAG laser, a plasma or the like.

Figure 2:
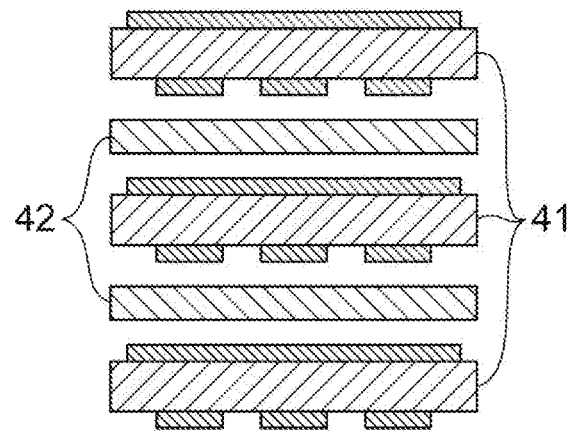
FIG. 2 is a schematic diagram illustrating a production step of an inner layer circuit board.
Figure 2:
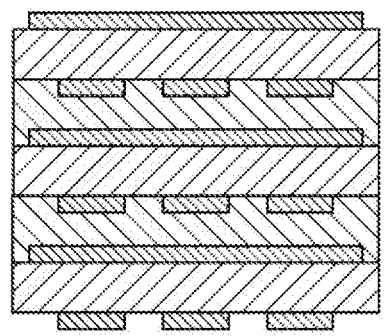
Figure 2:
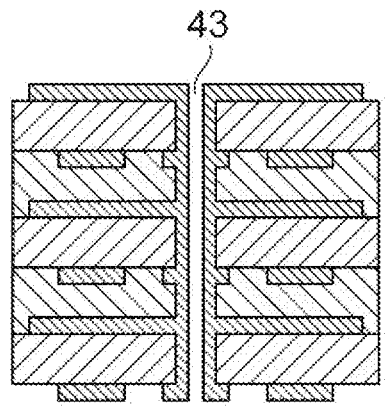

Here, the inner layer circuit board 11 may also be produced by steps (p) to (r) illustrated in FIG. 2. FIG. 2 is a diagram schematically illustrating production steps of an inner layer circuit board. That is, the production method of the multilayered printed wiring board according to the present embodiment may comprise a step (p), a step (q), a step (r), the step (a), the step (b) and the step (c). Hereinafter, the steps (p) to (r) will be described.

First, as illustrated in FIG. 2(p), in the step (p), core substrates 41 and prepregs 42 are laminated. As the core substrate, there can be used, for example, a glass epoxy substrate, a metal substrate, a polyester substrate, a polyimide substrate, a BT resin substrate, or a thermosetting polyphenylene ether substrate. As the prepreg, there can be used, for example, "GWA-900G", "GWA-910G", "GHA-679G", "GHA-679G(S)", "GZA-71G" or "GEA-75G" (all, trade names), manufactured by Hitachi Chemical Co., Ltd.

Then, as illustrated in FIG. 2(q), in the step (q), a laminated body, obtained in the step (p), of the core substrates 41 and the prepregs 42 is heated and pressed. The heating temperature is not especially limited, but it is preferable to be 120 to 230° C.; and being 150 to 210° C. is more preferable. Further the pressing pressure is not especially limited, but it is preferable to be 1 to 5 MPa; and being 2 to 4 MPa is more preferable. The heating time is not especially limited, but it is preferable to be 30 to 120 min Thereby, there can be obtained an inner layer circuit board excellent in the dielectric characteristics, and the mechanical and electrical connection reliability in a high-temperature high-humidity.

Further as illustrated in FIG. 2(r), in the step (r), as required, a through hole 43 is formed in the inner layer circuit board. A formation method of the through hole 43 is not especially limited, and may be the same as the above-mentioned step of forming the antenna circuit layer, or may use a known method.

By the above steps, there can be produced the multilayered printed wiring board of the present embodiment. The steps (a) to (c) may further be repeated by using the printed wiring board produced in the above steps as an inner layer circuit board.

Figure 3:
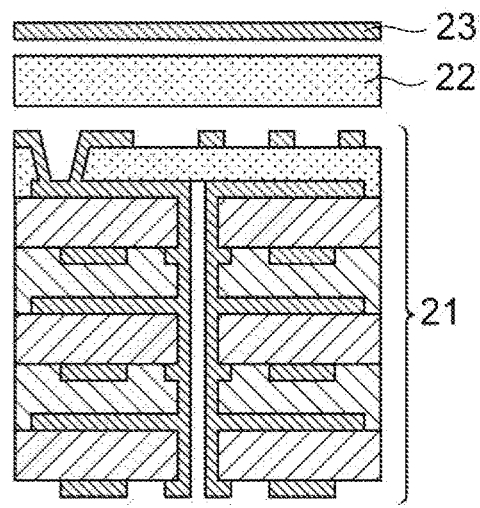
FIG. 3 is a schematic diagram illustrating a production step of a multilayered printed wiring board according to the present embodiment.
Figure 3:
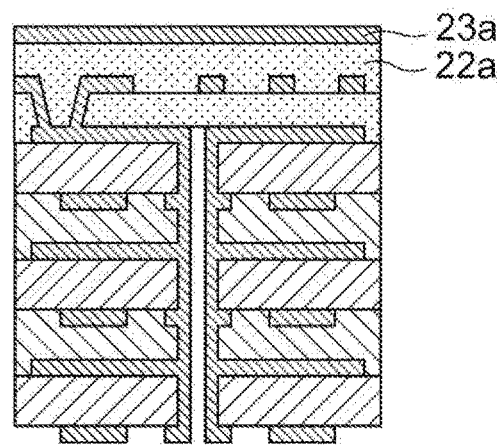
Figure 3:
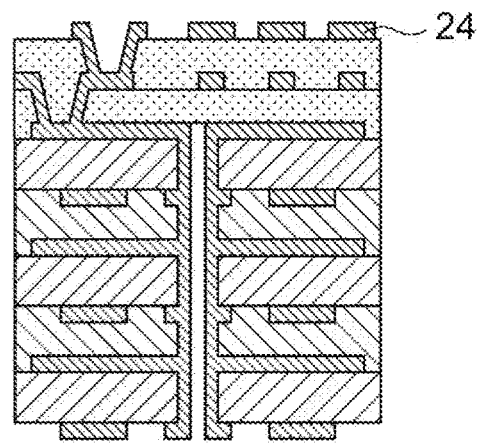

FIG. 3 is a diagram schematically illustrating production steps, of a multilayered printed wiring board, using the multilayered printed wiring board produced by the steps illustrated in FIG. 1 as an inner layer circuit board. FIG. 3(a), FIG. 3(b) and FIG. 3(c) correspond to FIG. 1(a), FIG. 1(b) and FIG. 1(c), respectively.

Specifically, FIG. 3(a) illustrates a step of laminating a resin film 22 on an inner layer circuit board 21 to form a resin layer 22s, and as required, laminating a metal foil 23 on the resin film 22 to form a metal layer 23a. FIG. 3(b) illustrates a step of heating and pressing the resin layer 22a to cure the resin layer 22a; and FIG. 3(c) illustrates a step of forming an antenna circuit layer 24 on the cured resin layer.

In FIG. 1 and FIG. 3, the number of the resin layers laminated on the inner layer circuit board for the purpose of forming an antenna circuit pattern and the like is made to be one layer or two layers, but the number thereof is not limited thereto; and the number of layers may be made to be 3 or more layers according to the antenna circuit design. By making an antenna circuit layer to be multilayered, it becomes easy to design antennas having wideband characteristics and antennas exhibiting little angular variation (beam tiltless) in antenna radiation patterns in the use frequency band.

The production method of the multilayered printed wiring board according to the present embodiment, since forming the resin layer by using the resin composition containing a compound having a maleimido group, a divalent group having at least two imido bonds, and a saturated or unsaturated divalent hydrocarbon group, can fabricate the laminated body without providing an adhesive layer except for providing the layer excellent in the high-frequency characteristics. Thereby, the simplification of the steps can be achieved and the effect of further improving the high-frequency characteristics can be attained.

The resin film, the support with a resin layer, the prepreg, the laminate, and the multilayered printed wiring board which use the resin composition of the present embodiment as described above can suitably be used for electronic devices handling high-frequency signals of 1 GHz or higher, particularly electronic devices handling high-frequency signals of 10 GHz or higher.

Hitherto, the preferred embodiments according to the present invention have been described, but are taken as examples to describe the present invention; and there is no tenor of limiting the scope of the present invention to the embodiments. The present invention can be carried out in various modes different from the above embodiments without departing from its gist.

EXAMPLES

Hereinafter, the present invention will be described in more detail based on Examples and Comparative Examples. However, the present invention is not limited to the following Examples.

[Resin Compositions]

Various resin compositions were prepared according to the following procedure. The amounts (parts by mass) of each raw material used for the preparation of resin compositions of Examples 1 to 8, Examples A1 to A4 and Comparative Examples 1 to 4 are collectively shown in Table 1 and Table 2.

Each component indicated in Table 1 or 2 was charged in a 300-mL four-necked flask equipped with a thermometer, a reflux cooling tube and a stirring apparatus, stirred at 25° C. for 1 hour, and thereafter filtered with a #200 nylon mesh (opening: 75 μm) to thereby obtain resin compositions.

Here, the abbreviations and the like of each material in Table 1 and Table 2 are as follows.

(1) BMI-1500 [Mw: about 1500, manufactured by Designer Molecules Inc., trade name]
(2) BMI-1700 [Mw: about 1700, manufactured by Designer Molecules Inc., trade name]
(3) BMI-3000 [Mw: about 3000, manufactured by Designer Molecules Inc., trade name]
(4) BMI-5000 [Mw: about 5000, manufactured by Designer Molecules Inc., trade name]
(5) BMI-1000 [bis(4-maleimidophenyl)methane, manufactured by Daiwa Kasei Industrial Co., Ltd., trade name]
(6) BMI-4000 [2,2-bis(4-(4-maleimidophenoxy)phenyl)propane, manufactured by Daiwa Kasei Industrial Co., Ltd., trade name]
(7) BMI-2300 [a polyphenylmethanemaleimide, manufactured by Daiwa Kasei Industrial Co., Ltd., trade name]
(8) MIR-3000 [a biphenylaralkyl-type maleimide, manufactured by Nippon Kayaku Co., Ltd., trade name]
(9) B-3000 [a butadiene homopolymer, Mn: about 3000, manufactured by Nippon Soda Co., Ltd., trade name]
(10) PP0640 [a polyphenylene ether, Mn: about 16000, manufactured by SABIC Innovative Plastics, trade name]
(11) NC-3000H [a biphenylaralkyl-type epoxy resin, manufactured by Nippon Kayaku Co., Ltd., trade name]
(12) BADCY [2,2-bis(4-cyanatophenyl)propane, manufactured by Lonza Group AG trade name]
(13) KA1165 [a novolac phenol resin, manufactured by DIC Corp., trade name]
(14) PCP [p-cumylphenol, manufactured by Wako Pure Chemical Industries, Ltd., trade name]
(15) H1041 [a hydrogenated substance of a styrene-butadiene copolymer of less than 60000 in Mn, styrene content ratio: 30%, Mn: 58000, manufactured by Asahi Kasei Chemicals Corp., trade name: "Tuftec H1041"]
(16) A silica slurry [a spherical fused silica, surface treatment: a phenylaminosilane coupling agent (1% by mass/total solid content in the slurry), disperse medium: methyl isobutyl ketone (MIBK), solid content concentration: 70% by mass, average particle diameter: 0.5 μm, density: 2.2 g/cm$^3$, manufactured by Admatex Co., Ltd., trade name: "SC-2050KNK"]
(17) Perhexine 25B [2,5-dimethyl-2,5-di(t-butylperoxy)hexane, NOF Corp., trade name]
(18) 2E4MZ [2-ethyl-4-methyl-imidazole, manufactured by Shikoku Chemicals Corp., trade name]
(19) Zinc naphthenate [manufactured by Tokyo Chemical Industry Co., Ltd.]

TABLE 1

| | | Examples | | | | | | | |
|---|---|---|---|---|---|---|---|---|---|
| | | 1 | 2 | 3 | 4 | 5 | 6 | 7 | 8 |
| (A) Component | BMI-1500 | 21.3 | — | — | — | — | — | — | — |
| | BMI-1700 | — | 19.8 | — | — | — | — | — | — |
| | BMI-3000 | — | — | 21.3 | — | 16.8 | 21.8 | 28.3 | 16.0 |
| | BMI-5000 | — | — | — | 19.8 | — | — | — | — |
| (B) Component | BMI-1000 | 5.1 | — | — | — | 4.0 | 4.6 | 4.8 | — |
| | BMI-4000 | — | 6.6 | — | — | — | — | — | 3.1 |
| | BMI-2300 | — | — | 5.1 | — | — | — | — | — |
| | MIR-3000 | — | — | — | 6.6 | — | — | — | — |
| Liquid Polybutadiene Resin | B-3000 | — | — | — | — | — | — | — | 6.5 |
| Polyphenylene Ether Resin | PP0640 | — | — | — | — | — | — | — | 0.8 |
| Epoxy Resin | NC-3000H | — | — | — | — | 4.0 | — | — | — |
| Cyanate Ester Resin | BADCY | — | — | — | — | — | 2.2 | — | — |
| Phenol Resin | KA1165 | — | — | — | — | 1.6 | — | — | — |
| | PCP | — | — | — | — | — | 0.2 | — | — |
| Thermoplastic Elastomer | H1041 | — | — | — | — | — | — | 1.6 | — |
| Silica Slurry | | 104.4 | 104.4 | 104.4 | 104.4 | 104.4 | 104.4 | 104.4 | 104.4 |
| | (MIBK) | (31.3) | (31.3) | (31.3) | (31.3) | (31.3) | (31.3) | (31.3) | (31.3) |
| Catalyst | Perhexine 25B | 0.53 | 0.53 | 0.53 | 0.53 | 0.42 | 0.48 | 0.53 | 0.53 |
| | 2E4MZ | — | — | — | — | 0.11 | — | — | — |
| | Zinc Naphthenate | — | — | — | — | — | 0.05 | — | — |

TABLE 1-continued

|  |  | Examples | | | | | | | |
|---|---|---|---|---|---|---|---|---|---|
|  |  | 1 | 2 | 3 | 4 | 5 | 6 | 7 | 8 |
| Solvent | Toluene | 9.1 | 8.5 | 11.3 | 11.3 | 8.9 | 10.3 | 10.6 | 6.9 |
|  | Methyl Ethyl Ketone | 2.2 | 2.8 | 0.0 | 0.0 | 2.4 | 1.0 | 0.7 | 4.5 |

TABLE 2

|  |  | Examples | | | | Comparative Examples | | | |
|---|---|---|---|---|---|---|---|---|---|
|  |  | A1 | A2 | A3 | A4 | 1 | 2 | 3 | 4 |
| (A) Component | BMI-1500 | 26.4 | — | — | — | — | — | — | — |
|  | BMI-1700 | — | 26.4 | — | — | — | — | — | — |
|  | BMI-3000 | — | — | 26.4 | — | — | — | — | — |
|  | BMI-5000 | — | — | — | 26.4 | — | — | — | — |
| (B) Component | BMI-1000 | — | — | — | — | 26.4 | — | — | — |
|  | BMI-4000 | — | — | — | — | — | 26.4 | — | — |
|  | BMI-2300 | — | — | — | — | — | — | 26.4 | — |
|  | MIR-3000 | — | — | — | — | — | — | — | 26.4 |
| Silica Slurry | | 104.4 | 104.4 | 104.4 | 104.4 | 104.4 | 104.4 | 104.4 | 104.4 |
| (MIBK) | | (31.3) | (31.3) | (31.3) | (31.3) | (31.3) | (31.3) | (31.3) | (31.3) |
| Catalyst | Perhexine 25B | 0.53 | 0.53 | 0.53 | 0.53 | 0.53 | 0.53 | 0.53 | 0.53 |
| Solvent | Toluene | 11.3 | 11.3 | 11.3 | 11.3 | 11.3 | 11.3 | 11.3 | 11.3 |
|  | Methyl Ethyl Ketone | 0.0 | 0.0 | 0.0 | 0.0 | 0.0 | 0.0 | 0.0 | 0.0 |

Here, presumed structures of compounds used as the above (A) components are as follows. The following formulae (XII-1) to (XII-3) correspond to the above (1) to (3), respectively, and (4) has a structure of the formula (XII-3) and has a larger weight-average molecular weight than (3). In the formulae (XII-1) to (XII-3), n represents an integer of 1 to 10.

[Chemical Formula 27]

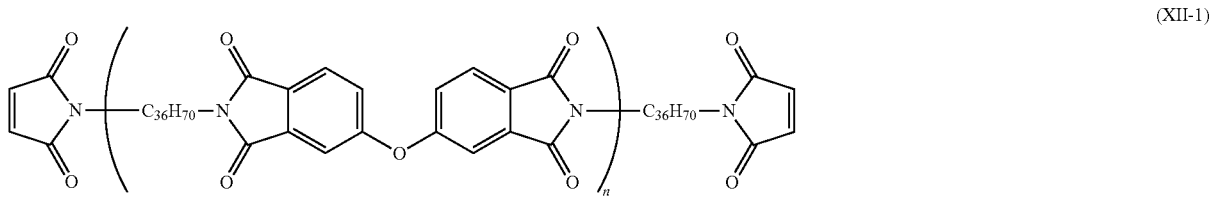

(XII-1)

[Chemical Formula 28]

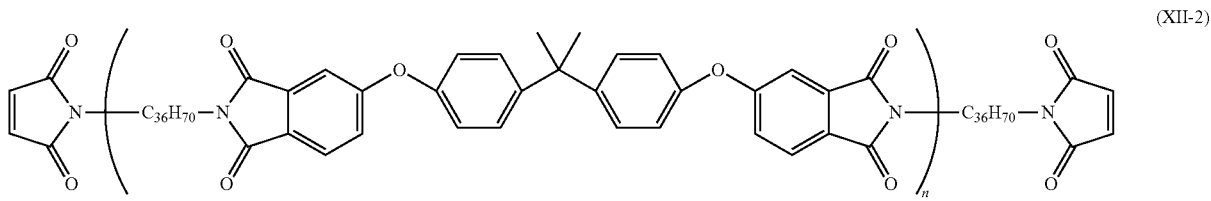

(XII-2)

[Chemical Formula 29]

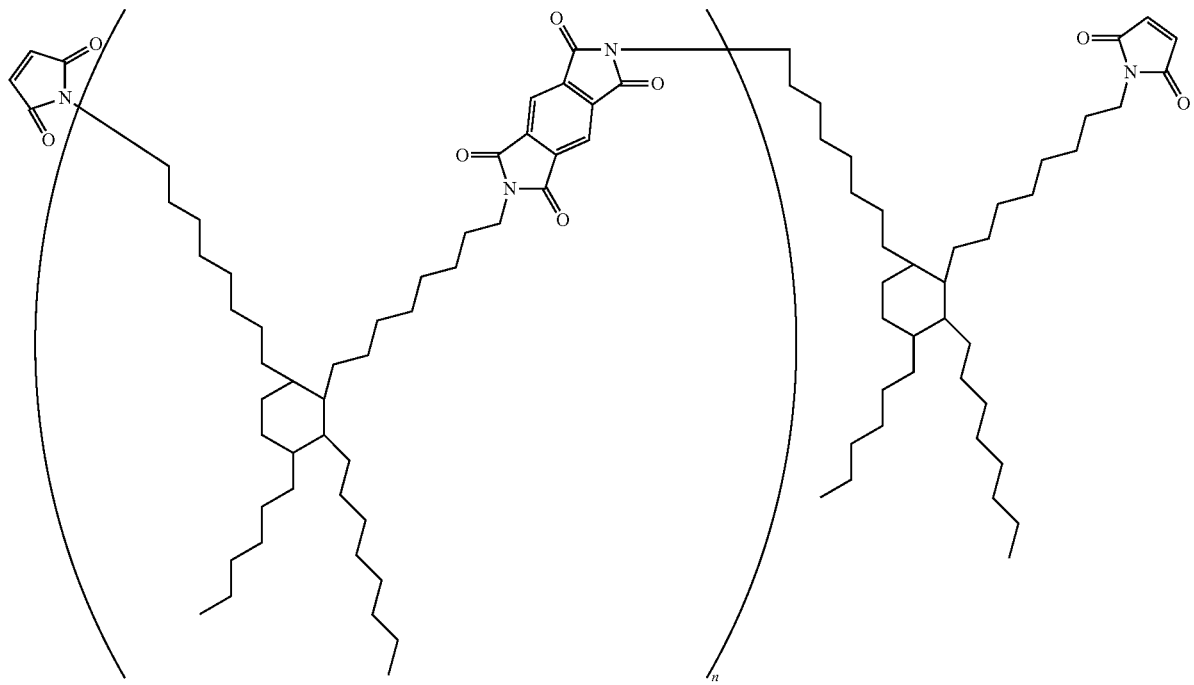

(XII-3)

[Supports with a Resin Layer]

The resin compositions obtained in Examples and Comparative Examples were each applied (drying temperature: 130° C.) on a PET film (G2-38, manufactured by Teijin Ltd.) of 38 μm in thickness as a support base material by using a comma coater to thereby fabricate semicured resin films with a PET film, which had a resin layer in a semicured state and were supports with the resin layer. The thickness of the semicured resin films (resin layers) was 50 μm.

[Evaluation of the Resin Films (Resin Layers)]

There were evaluated the appearance and the handleability of the semicured resin films of the Examples and the Comparative Examples. The results are shown in Table 3 and Table 4.

The appearance was visually evaluated according to the following criteria.

A: there were no unevenness, no streaks and the like on the surface of the semicured resin film.

B: there were more or less unevenness, streaks and the like on the surface of the semicured resin film, and the surface smoothness was poor.

The handleability was evaluated visually and tactually according to the following criteria.

(1) Presence/absence of tackiness on the surface at 25° C.

(2) Presence/absence of resin cracking or powder dropping when being cut by a cutter knife.

A: Both of the above (1) and (2) were absent.

B: At least either one of the above (1) and (2) was present.

[Multilayered Printed Wiring Boards]

Multilayered printed wiring boards were fabricated by the following procedure by using the above-mentioned supports with a resin layer.

A glass fabric base epoxy resin copper-clad laminate having circuit patterns formed therein was used as an inner layer circuit board; one sheet of the semicured resin film obtained by peeling the PET film off from the above support with a resin layer was placed on each of both surfaces of the inner layer circuit board; an electrodeposited copper foil (manufactured by Nippon Denkai, Ltd., trade name: "YGP-12") of 12 μm in thickness was disposed on each of the sheets; thereafter, end plates were placed thereon; and the resultant was subjected to heating and pressing molding under the pressing condition of 200° C./3.0 MPa/70 min to thereby fabricate a 4-layered printed wiring board.

Then, the copper foils of the outermost layers of the fabricated 4-layered printed wiring board were etched to evaluate the circuit embeddability (multilayering moldability). The multilayering moldability was visually evaluated according to the following criteria.

A: No voids nor blurs were present on the circuits.

B: More or less voids and blurs were present.

[Double-Sided Metal-Clad Cured Resin Films]

After two sheets of the resin film obtained by peeling the PET film off from the above support with a resin layer were stacked; a low-profile copper foil (M-surface Rz: 3 μm, manufactured by Furukawa Electric Co., Ltd., trade name: "F3-WS") of 18 μm in thickness was disposed on each of both surfaces of the stacked two sheets so that the roughened surface (M-surface) contacted therewith; an end plate was placed on each of the copper foils; and the resultant was subjected to heating and pressing molding under the pressing condition of 200° C./3.0 MPa/70 min to thereby fabricate a double-sided metal-clad cured resin film (thickness: 0.1 mm).

For the above double-sided metal-clad cured resin film, there were evaluated the handleability (bending resistance), the dielectric characteristics, the copper foil peel strength, the solder heat resistance, the water absorption coefficient and the insulation reliability. The evaluation results are shown in Table 3 and Table 4. Methods for evaluating characteristics of the double-sided metal-clad cured resin film were as follows.

[Bending Resistance]

The bending resistance was evaluated according to the following criteria by bending, by 180°, the double-sided metal-clad cured resin film whose outer layer copper foils had been etched.

A: No breaking nor cracking were generated on bending.

B: More or less breaking and cracking were generated on bending.

[Dielectric Characteristics]

The relative dielectric constant and the dielectric loss tangent being the dielectric characteristics were measured, by a cavity resonator perturbation method, by using a test piece prepared by etching the outer layer copper foils of the double-sided metal-clad cured resin film and cutting the resultant into 60 mm in length, 2 mm in width and about 1 mm in thickness. A measuring device used was a vector network analyzer E8364B, manufactured by Agilent Technologies, Inc.; cavity resonators used were CP129 (10-GHz band resonator) and CP137 (20-GHz band resonator), manufactured by Kanto Electronics Application and Development Inc.; and the measurement program used was CPMA-V2. The condition was set at frequencies of 10 GHz and 20 GHz and at a measurement temperature of 25° C.

[Copper Foil Peel Strength]

The copper foil peel strength was measured according to the standard for test methods of copper-clad laminates, JIS-C-6481. The measurement temperature was set at 25° C.

[Solder Heat Resistance]

For the evaluation of the solder heat resistance, test pieces were prepared by etching the copper foil of one side of the double-sided metal-clad cured resin film and cutting the resultant into 50 mm square; the test pieces in the normal condition and test pieces having been treated for predetermined times (1, 3 and 5 hours) in a pressure cooker test (PCT) apparatus (condition: 121° C., 2.2 atm) were made to flow on a molten solder at 288° C. for 20 sec; and the appearance of three sheets of the cured resin films different in the treatment time was visually evaluated according to the following criteria. Here, in Table 3 and Table 4, the test piece having been treated for 1 hour is represented as PCT-1h; the test piece having been treated for 3 hours is represented as PCT-3h; and the test piece having been treated for 5 hours is represented as PCT-5h.

A: No generation of blistering or measling in the film interior and between the film and the copper foil was recognized.

B: Generation of blistering or measling in the film interior and between the film and the copper foil was observed.

[Water Absorption Coefficient]

For the evaluation of the water absorption coefficient, test pieces were prepared by etching the copper foils of both sides of the double-sided metal-clad cured resin film and cutting the resultant into 50 mm square; the test piece in the normal condition and the test piece having been treated for a predetermined time (5 hours) in a pressure cooker test (PCT) apparatus (condition: 121° C., 2.2 atm) were prepared; and the masses of the test pieces before the treatment and after the treatment were measured and the increasing proportion (% by weight) of the masses after the treatment to before the treatment was calculated.

[Thermal Expansion Coefficient (CTE)]

For the evaluation of the thermal expansion coefficient (in the film thickness direction), a test piece was prepared by etching the copper foils of both sides of the double-sided metal-clad cured resin film and cutting the resultant into 50 mm square; and the thermal expansion coefficient of the test piece was measured by a thermomechanical analyzer TMA (manufactured by TA Instruments Inc., Q400)(temperature range: 30 to 150° C., load: 5 g) according to the IPC standard (IPC-TM-650 2.4.24).

TABLE 3

| | | Examples | | | | | | | |
|---|---|---|---|---|---|---|---|---|---|
| | | 1 | 2 | 3 | 4 | 5 | 6 | 7 | 8 |
| Semicured Resin Film Characteristics | Appearance | A | A | A | A | A | A | A | A |
| | Handleability | A | A | A | A | A | A | A | A |
| | Multilayering Formability | A | A | A | A | A | A | A | A |
| Bending Resistance | | A | A | A | A | A | A | A | A |
| Relative Dielectric Constant | 10 GHz | 2.96 | 2.96 | 2.96 | 2.98 | 3.18 | 3.00 | 2.94 | 2.94 |
| | 20 GHz | 2.95 | 2.95 | 2.95 | 2.97 | 3.16 | 2.99 | 2.93 | 2.94 |
| Dielectric Loss Tangent | 10 GHz | 0.0018 | 0.0018 | 0.0014 | 0.0016 | 0.0027 | 0.0022 | 0.0014 | 0.0015 |
| | 20 GHz | 0.0018 | 0.0018 | 0.0014 | 0.0016 | 0.0028 | 0.0023 | 0.0014 | 0.0015 |
| CTE (ppm/° C.) | | 40 | 40 | 35 | 38 | 30 | 32 | 40 | 42 |
| Copper Foil Peel Strength (kN/m) | | 0.7 | 0.7 | 0.6 | 0.6 | 0.7 | 0.7 | 0.6 | 0.6 |
| Water Absorption Coefficient (wt %) | PCT-5 h | 0.22 | 0.22 | 0.17 | 0.18 | 0.34 | 0.38 | 0.16 | 0.22 |
| Solder Heat Resistance | PCT-1 h | A | A | A | A | A | A | A | A |
| | PCT-3 h | A | A | A | A | A | A | A | A |
| | PCT-5 h | A | A | A | A | A | A | A | A |

TABLE 4

|  |  | Examples | | | | Comparative Examples | | | |
| --- | --- | --- | --- | --- | --- | --- | --- | --- | --- |
|  |  | A1 | A2 | A3 | A4 | 1 | 2 | 3 | 4 |
| Semicured | Appearance | A | A | A | A | B | B | B | B |
| Resin Film | Handleability | A | A | A | A | B | B | B | B |
| Characteristics | Multilayering Formability | A | A | A | A | B | B | B | B |
| Bending Resistance | | A | A | A | A | A | A | A | A |
| Relative | 10 GHz | 2.94 | 2.94 | 2.94 | 2.96 | 3.16 | 3.12 | 3.21 | 3.10 |
| Dielectric Constant | 20 GHz | 2.93 | 2.93 | 2.93 | 2.95 | 3.14 | 3.10 | 3.19 | 3.08 |
| Dielectric Loss Tangent | 10 GHz | 0.0013 | 0.0013 | 0.0012 | 0.0014 | 0.0044 | 0.0042 | 0.0048 | 0.0040 |
|  | 20 GHz | 0.0014 | 0.0014 | 0.0012 | 0.0014 | 0.0055 | 0.0053 | 0.0057 | 0.0051 |
| CTE (ppm/° C.) | | 90 | 90 | 85 | 87 | 30 | 32 | 30 | 25 |
| Copper Foil Peel Strength (kN/m) | | 0.8 | 0.8 | 0.6 | 0.6 | 0.6 | 0.6 | 0.6 | 0.7 |
| Water Absorption Coefficient (wt %) | PCT-5 h | 0.20 | 0.22 | 0.17 | 0.18 | 0.60 | 0.62 | 0.58 | 0.56 |
| Solder Heat Resistance | PCT-1 h | A | A | A | A | A | A | A | A |
|  | PCT-3 h | A | A | A | A | A | A | A | A |
|  | PCT-5 h | A | A | A | A | A | A | A | A |

As is clear from the results shown in Table 3 and Table 4, it was confirmed that the semicured resin films fabricated by using the resin compositions of Examples 1 to 8 and Examples A1 to A4 posed no problem with the appearance (surface uniformity) and the handleability (tackiness, cracking, powder dropping and the like), and were good also in the multilayering moldability. Additionally, any of the cured resin films being cured substances of the resin compositions of Examples 1 to 8 and Examples A1 to A4 were excellent in both of the relative dielectric constant and the dielectric loss tangent, and were excellent also in the solder heat resistance, the copper foil peel strength and the water absorption coefficient.

Further a lower thermal expansion coefficient could be achieved in cases (Examples 1 to 8) where an (A) component and a (B) component were used in combination than in cases (Examples A1 to A4) where an (A) component was used singly.

Printed Wiring Boards for a Millimeter-Wave Radar

Example 1

An inner layer circuit board 11 was fabricated by the step illustrated in FIG. 2, and thereafter, there was fabricated a printed wiring board for a millimeter-wave radar having a structure of 7 layers in total containing one layer of a millimeter-wave antenna circuit layer by using the resin film of Example 1 by the step illustrated in FIG. 1.

First, in the step (p), substrates for inner layer circuits were fabricated by removing, by etching, unnecessary copper foil portions of a glass fabric base epoxy copper-clad laminate (manufactured by Hitachi Chemical Co., Ltd., trade name: "MCL-E-75G") of 0.1 mm in thickness on both sides of which a copper foil of 18 μm in thickness was laminated; and thereafter, a glass fabric base epoxy prepreg (manufactured by Hitachi Chemical Co., Ltd., trade name: "GEA-75G") of 0.1 mm was disposed in a stacked manner between the copper-clad laminates to thereby fabricate a structural body. Then, in the step (q), the structural body fabricated in the step (p) was subjected to heating and pressing molding under the pressing condition of 180° C./3.0 MPa/60 min to thereby form a unified board. Then, in the step (r), the unified board fabricated in the step (q) was subjected to drill boring on a desired position, and copper plating was carried out in the bored hole to thereby fabricate an inner layer circuit board 11.

In the step (a), the semicured resin film (thickness: 130 μm) fabricated by using the resin composition of Example 1 was tentatively adhered on the surface of the inner layer circuit board 11 by a vacuum laminator; and a low-profile copper foil (manufactured by Furukawa Electric Co., Ltd., trade name: "F3-WS") of 18 μm in thickness was further disposed thereon to thereby fabricate a structural body. Then, in the step (b), end plates were placed on the structural body fabricated in the step (a), and the resultant was subjected to heating and pressing molding under the pressing condition of 200° C./3.0 MPa/70 min. Then, in the step (c), removal of unnecessary resin portions and formation of a via hole (IVH) were carried out on desired positions of the structural body fabricated in the step (b) by laser; thereafter, plating and etching were carried out to form an antenna circuit layer 14 to thereby obtain a multilayered printed wiring board having a structure of 7 layers in total containing one layer of the millimeter-wave antenna circuit layer.

Example 2

By using the resin film of Example 2, there was fabricated, by the step illustrated in FIG. 3, a printed wiring board for a millimeter-wave radar having a structure of 8 layers in total containing two layers of millimeter-wave antenna circuit layers.

In the step (a), the printed wiring board for a millimeter-wave radar fabricated in Example 1 was used as an inner layer circuit board 21; the semicured resin film (thickness: 130 μm) fabricated by using the resin composition of Example 2 was tentatively adhered on the surface of the inner layer circuit board 21 by a vacuum laminator; and thereafter the "F3-WS" was disposed thereon to thereby fabricate a structural body. Then, in the step (b), end plates were placed on the structural body fabricated in the step (a), and the resultant was subjected to heating and pressing molding under the pressing condition of 200° C./3.0 MPa/70 min. Then, in the step (c), removal of unnecessary resin portions and formation of a via hole (IVH) were carried out on desired positions of the structural body fabricated in the step (b) by laser; thereafter, plating and etching were carried out to form an antenna circuit layer 24 to thereby obtain a printed wiring board for a millimeter-wave radar having a structure of 8 layers in total containing two layers of the millimeter-wave antenna circuit layers.

Comparative Example 5

Figure 4:
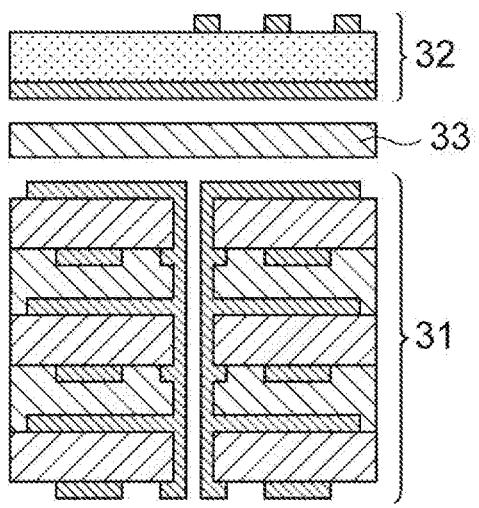
FIG. 4 is a schematic diagram illustrating a conventional production step of a multilayered printed wiring board.
Figure 4:
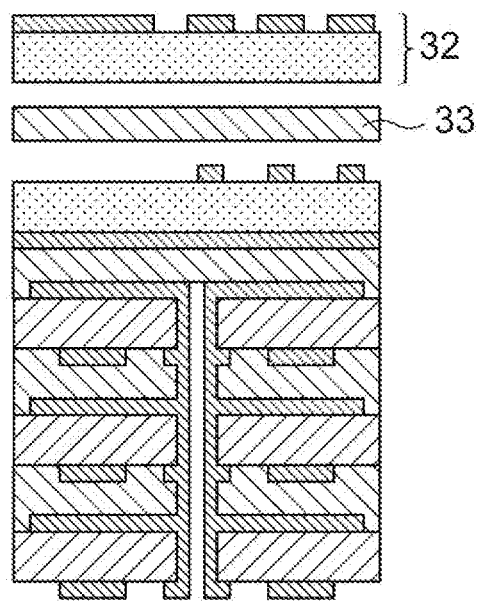
Figure 4:
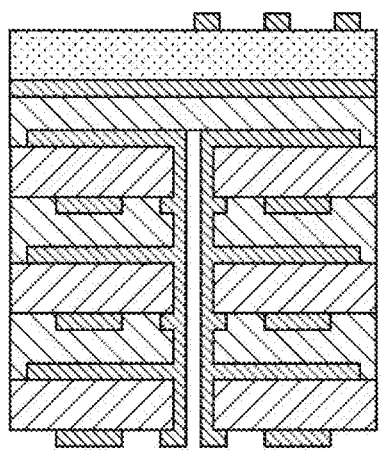
Figure 4:
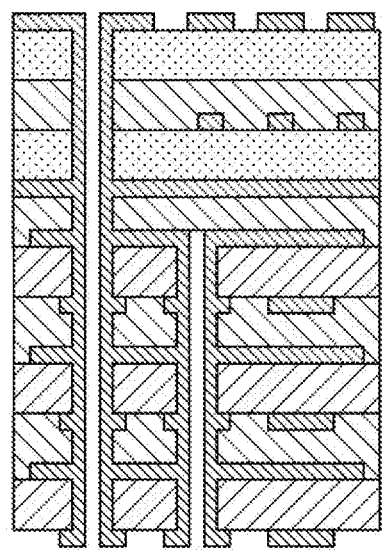

By using a fluororesin material in place of the resin film of Example 2, there was fabricated, by the step illustrated in FIG. 4, which was conventional means, a printed wiring board for a millimeter-wave radar having a structure of 8 layers in total containing two layers of the millimeter-wave antenna circuit layers.

First, in a step (a') of FIG. 4, on the inner layer circuit board 31 fabricated in the above steps (p) to (r), a glass fabric base epoxy prepreg (GEA-75G) 33 of 0.1 mm and a copper-clad laminate 32 prepared by removing, by etching, unnecessary copper foil portions from a fluororesin base copper-clad laminate (manufactured by Rogers Corp., trade name: "RO-3003") of 0.13 mm were disposed in a stacked manner to thereby fabricate a structural body. Then, in a step (b'), the structural body fabricated in the step (a') was subjected to heating and pressing molding under the pressing condition of 180° C./3.0 MPa/60 min to thereby fabricate a multilayered wiring board having a structure of 7 layers in total containing one layer of an antenna circuit. Then, in a step (c'), on the multilayered wiring board fabricated in the step (b'), a glass fabric base epoxy prepreg (GEA-75G) 33 of 0.1 mm and a copper-clad laminate 32 prepared by removing, by etching, unnecessary copper foil portions from a fluororesin base copper-clad laminate (RO-3003) of 0.13 mm were disposed in a stacked manner to thereby fabricate a structural body. Then, in a step (d'), the structural body fabricated in the step (c') was subjected to heating and pressing molding under the pressing condition of 180° C./3.0 MPa/60 min; and thereafter, through-hole boring to plating to etching were carried out to thereby form a desired circuit to thereby obtain a printed wiring board for a millimeter-wave radar having a structure of 8 layers in total containing two layers of antenna circuits.

Although the method of Comparative Example 5 could form antenna circuits having a multilayered structure even in use of the fluororesin base copper-clad laminate, an adhesive layer such as a prepreg was necessitated between the fluororesins. At this time, since a common adhesive layer such as a prepreg was poorer in the relative dielectric constant and the dielectric loss tangent in the millimeter-wave band than the fluororesin material, the antenna circuit characteristics of the multilayered structure were easily deteriorated due to the presence of the adhesive layer between the fluororesins.

By contrast, the method of Example 2, since constituting the antenna circuit having the multilayered structure of the material alone excellent in the relative dielectric constant and the dielectric loss tangent in the millimeter-wave band, can form the antenna circuit having the multilayered structure better in the characteristics than the method of Comparative Example 5.

INDUSTRIAL APPLICABILITY

The resin composition according to the present invention, since developing various characteristics and excellent high-frequency characteristics required for printed wiring boards, is useful in applications to members and components of printed wiring boards to be used for electronic devices handling high-frequency signals of 1 GHz or higher or 10 GHz or higher, mobile communication devices and base station apparatuses thereof, network-related electronic devices such as severs and routers, and various electronic devices such as large computers.

REFERENCE SIGNS LIST 11, 21, 31 . . . INNER LAYER CIRCUIT BOARD, 12, 22 . . . RESIN FILM, 12a, 22a . . . RESIN LAYER, 13, 23 . . . METAL FOIL, 13a, 23a . . . METAL LAYER, 14, 24 . . . ANTENNA CIRCUIT LAYER, 15 . . . VIA HOLE, 32 . . . COPPER-CLAD LAMINATE, 33, 42 . . . PREPREG, 41 . . . CORE SUBSTRATE, and 43 . . . THROUGH-HOLE.

The invention claimed is:

1. A resin composition comprising:
   a compound (A) having a maleimido group, a divalent group having at least two imido bonds, and a saturated or unsaturated divalent hydrocarbon group, the divalent hydrocarbon group not including a phenylene group, wherein the divalent group having at least two imido bonds is a group represented by the following formula (I):

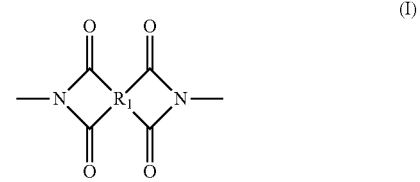

wherein in the formula (I), $R_1$ represents a tetravalent organic group;
   a maleimido group-containing compound (B) different from the compound (A), the maleimido group-containing compound (B) comprising an aromatic ring; and
   an inorganic filler,
   wherein the content of the compound (A) is 2% by mass or greater and 50% by mass or less based on the total mass of the resin composition, and
   the content ratio of the inorganic filler is 5 to 70% by volume with respect to the total volume of the solid content in the resin composition.

2. The resin composition according to claim 1, wherein the number of carbon atoms of the saturated or unsaturated divalent hydrocarbon group is 8 to 100.

3. The resin composition according to claim 1, wherein the saturated or unsaturated divalent hydrocarbon group is a group represented by the following formula (II):

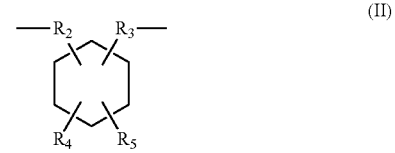

wherein in the formula (II), $R_2$ and $R_3$ each independently represent an alkylene group having 4 to 50 carbon atoms; $R_4$ represents an alkyl group having 4 to 50 carbon atoms; and $R_5$ represents an alkyl group having 2 to 50 carbon atoms.

4. The resin composition according to claim 1, wherein the maleimido group-containing compound (B) has a structure having the maleimido group bonded to the aromatic ring.

5. The resin composition according to claim 1, wherein the maleimido group-containing compound (B) is a compound represented by the following formula (VI):

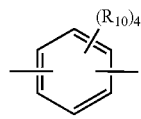
(VI)

wherein in the formula (VI), $A_4$ represents a residue represented by the following formula (VII), (VIII), (IX) or (X); and $A_5$ represents a residue represented by the following formula (XI):

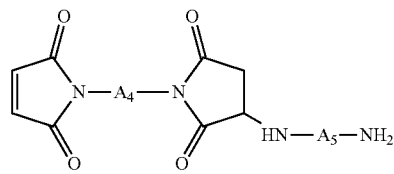
(VII)

wherein in the formula (VII), $R_{10}$ each independently represent a hydrogen atom, an aliphatic hydrocarbon group having 1 to 5 carbon atoms or a halogen atom,

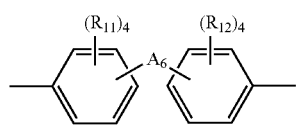
(VIII)

wherein in the formula (VIII), $R_{11}$ and $R_{12}$ each independently represent a hydrogen atom, an aliphatic hydrocarbon group having 1 to 5 carbon atoms or a halogen atom; and $A_6$ represents an alkylene group or an alkylidene group having 1 to 5 carbon atoms, an ether group, a sulfide group, a sulfonyl group, a ketone group, a single bond or a residue represented by the following formula (VIII-1):

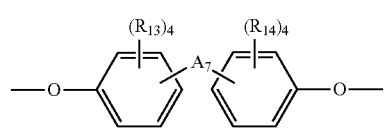
(VIII-1)

wherein in the formula (VIII-I), $R_{13}$ and $R_{14}$ each independently represent a hydrogen atom, an aliphatic hydrocarbon group having 1 to 5 carbon atoms or a halogen atom; and $A_7$ represents an alkylene group having 1 to 5 carbon atoms, an isopropylidene group, an ether group, a sulfide group, a sulfonyl group, a ketone group or a single bond,

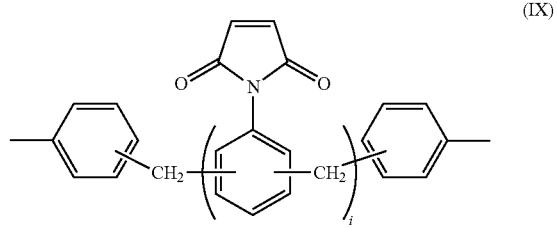
(IX)

wherein in the formula (IX), i is an integer of 1 to 10,

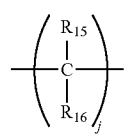
(X)

wherein in the formula (X), $R_{15}$ and $R_{16}$ each independently represent a hydrogen atom or an aliphatic hydrocarbon group having 1 to 5 carbon atoms; and j is an integer of 1 to 8,

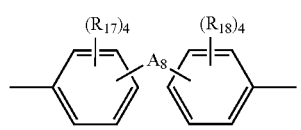
(XI)

wherein in the formula (XI), $R_{17}$ and $R_{18}$ each independently represent a hydrogen atom, an aliphatic hydrocarbon group having 1 to 5 carbon atoms, an alkoxy group having 1 to 5 carbon atoms, a hydroxyl group or a halogen atom; and $A_8$ represents an alkylene group or an alkylidene group having 1 to 5 carbon atoms, an ether group, a sulfide group, a sulfonyl group, a ketone group, a fluorenylene group, a single bond, a residue represented by the following formula (XI-1) or a residue represented by the following formula (XI-2):

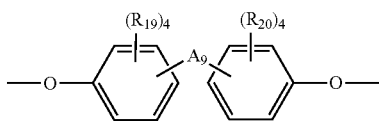
(XI-1)

wherein in the formula (XI-I), $R_{19}$ and $R_{20}$ each independently represent a hydrogen atom, an aliphatic hydrocarbon group having 1 to 5 carbon atoms or a halogen atom;

and $A_9$ represents an alkylene group having 1 to 5 carbon atoms, an isopropylidene group, a m-phenylenediisopropylidene group, a p-phenylenediisopropylidene group, an ether group, a sulfide group, a sulfonyl group, a ketone group or a single bond, and

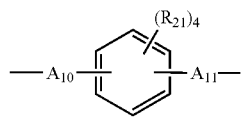

(XI-2)

wherein in the formula (XI-2), $R_{21}$ each independently represent a hydrogen atom, an aliphatic hydrocarbon group having 1 to 5 carbon atoms or a halogen atom; and $A_{10}$ and $A_{11}$ each independently represent an alkylene group having 1 to 5 carbon atoms, an isopropylidene group, an ether group, a sulfide group, a sulfonyl group, a ketone group or a single bond.

6. The resin composition according to claim 1, wherein a relative dielectric constant at 10 GHz of a cured substance of the resin composition is 3.6 or lower.

7. A support with a resin layer comprising:
a resin layer comprising the resin composition according to claim 1; and
a support base material.

8. A prepreg comprising:
the resin composition according to claim 1; and
a fiber base material.

9. A laminate comprising:
a resin layer comprising a cured substance of the resin composition according to claim 1; and
a conductor layer.

10. A multilayered printed wiring board comprising:
a resin layer comprising a cured substance of the resin composition according to claim 1; and
at least three layers of circuit layers.

11. The multilayered printed wiring board according to claim 10, wherein the number of the circuit layers is 3 to 20 layers.

12. A communication device comprising a multilayered printed wiring board for millimeter-wave radar, the multilayered printed wiring board comprising:
a resin layer comprising a cured substance of the resin composition according to claim 1; and
at least three layers of circuit layers.

13. The communication device according to claim 12, wherein the communication device comprises a mobile communication device.

14. A printed wiring board for a millimeter-wave radar comprising:
a resin layer comprising a cured substance of the resin composition according to claim 1; and
a circuit layer.

15. The resin composition according to claim 1, wherein the content of the compound (A) is 2% by mass or greater and 30% by mass or less based on the total mass of the resin composition.

16. A resin composition comprising:
a compound (A) having a maleimido group, a divalent group having at least two imido bonds, and a saturated or unsaturated divalent hydrocarbon group, the divalent hydrocarbon group not including a phenylene group, and the divalent hydrocarbon group being bonded between the maleimido group and the divalent group having at least two imido bonds;
a maleimido group-containing compound (B) different from the compound (A), the maleimido group-containing compound (B) comprising an aromatic ring; and
an inorganic filler,
wherein the content of the compound (A) is 2% by mass or greater and 50% by mass or less based on the total mass of the resin composition, and
the content ratio of the inorganic filler is 5 to 70% by volume with respect to the total volume of the solid content in the resin composition.

17. A support with a resin layer comprising:
a resin layer comprising the resin composition according to claim 16; and
a support base material.

18. A prepreg comprising:
the resin composition according to claim 16; and
a fiber base material.

19. A laminate comprising:
a resin layer comprising a cured substance of the resin composition according to claim 16; and
a conductor layer.

20. A multilayered printed wiring board comprising:
a resin layer comprising a cured substance of the resin composition according to claim 16; and
at least three layers of circuit layers.

21. A printed wiring board for a millimeter-wave radar comprising:
a resin layer comprising a cured substance of the resin composition according to claim 16; and
a circuit layer.

22. The resin composition according to claim 16, wherein the content of the compound (A) is 2% by mass or greater and 30% by mass or less based on the total mass of the resin composition.

* * * * *